(12) United States Patent
Sugaya

(10) Patent No.: US 11,073,568 B2
(45) Date of Patent: Jul. 27, 2021

(54) ELECTRONIC DEVICE AND STATE DETERMINATION METHOD OF ELECTRONIC DEVICE

(71) Applicant: Takayuki Sugaya, Tokyo (JP)

(72) Inventor: Takayuki Sugaya, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/782,482

(22) Filed: Feb. 5, 2020

(65) Prior Publication Data

US 2020/0271731 A1 Aug. 27, 2020

(30) Foreign Application Priority Data

Feb. 22, 2019 (JP) .............................. JP2019-030124

(51) Int. Cl.
*G01R 31/392* (2019.01)
*H01M 10/42* (2006.01)

(52) U.S. Cl.
CPC ...... *G01R 31/392* (2019.01); *H01M 10/4285* (2013.01)

(58) Field of Classification Search
CPC .................... G01R 31/392; H01M 10/4285
See application file for complete search history.

(56) References Cited

U.S. PATENT DOCUMENTS

| 5,703,465 A | 12/1997 | Kinoshita et al. |
| 7,528,576 B2* | 5/2009 | Ukon ............ G01R 31/3648 320/132 |
| 2006/0164043 A1* | 7/2006 | Ukon ................ H02J 7/0047 320/162 |
| 2010/0274508 A1* | 10/2010 | Koyama .......... H04M 1/724 702/63 |

(Continued)

FOREIGN PATENT DOCUMENTS

| EP | 3401636 | 11/2018 |
| EP | 3648236 | 5/2020 |

(Continued)

OTHER PUBLICATIONS

Extended European Search Report dated Jul. 21, 2020 (EP Patent Application No. 20157610.5).

*Primary Examiner* — Raymond L Nimox
(74) *Attorney, Agent, or Firm* — IPUSA, PLLC

(57) ABSTRACT

An electronic device includes a deformation amount detecting unit configured to detect a deformation amount of a secondary battery connected to the electronic device; a total charge/discharge amount detecting unit configured to detect a total charge/discharge amount of the secondary battery; a storage unit configured to store reference data representing a relationship between the deformation amount and the total charge/discharge amount; a state determining unit configured to determine a state of the secondary battery, based on the deformation amount detected by the deformation amount detecting unit, the total charge/discharge amount detected by (Continued)

the total charge/discharge amount detecting unit, and the reference data; and a notification control unit configured to perform a notification based on a result of the state of the secondary battery.

7 Claims, 22 Drawing Sheets

(56) References Cited

U.S. PATENT DOCUMENTS

| | | | | |
|---|---|---|---|---|
| 2011/0112782 | A1* | 5/2011 | Majima | H02J 7/0029 |
| | | | | 702/63 |
| 2011/0133571 | A1* | 6/2011 | Kiyohara | H01M 10/48 |
| | | | | 307/130 |
| 2011/0187329 | A1* | 8/2011 | Majima | G01R 31/50 |
| | | | | 320/149 |
| 2012/0290236 | A1 | 11/2012 | Majima | |
| 2015/0132621 | A1* | 5/2015 | Henrici | H01M 10/482 |
| | | | | 429/90 |
| 2017/0153292 | A1* | 6/2017 | Steiber | G01R 31/3648 |
| 2017/0269165 | A1* | 9/2017 | Takashima | G01R 31/388 |

FOREIGN PATENT DOCUMENTS

| | | |
|---|---|---|
| JP | H08-331769 | 12/1996 |
| JP | 2008-109742 | 5/2008 |
| JP | 2011-142003 | 7/2011 |
| JP | 2011-169817 | 9/2011 |
| JP | 2016-063692 | 4/2016 |
| WO | 2018/173360 | 9/2018 |

* cited by examiner

ELECTRONIC DEVICE AND STATE DETERMINATION METHOD OF ELECTRONIC DEVICE

CROSS-REFERENCE TO RELATED APPLICATION

This patent application is based on and claims priority to Japanese Patent Application No. 2019-030124 filed on Feb. 22, 2019, the entire contents of which are hereby incorporated by reference.

BACKGROUND OF THE INVENTION

1. Field of the Invention

The present invention relates to an electronic device and a method for determining a status of the electronic device.

2. Description of the Related Art

Lithium-ion batteries are widely used in electronic devices such as smartphones, but they are known to degrade gradually during use. As lithium-ion batteries deteriorate, internal pressure increases and expansion are evident due to internal stack expansion caused by charging/discharging, and due to electrolyte vaporization caused by increase in internal temperature. If these lithium-ion batteries are left in a degraded state, there is a risk of ignition or explosion.

Meanwhile, in recent years, in order to improve performance, design, and convenience of hardware against increasing complexity of software processing, a compact, thin, and high output lithium-ion battery is required. However, this means that lithium-ion batteries can easily become hazardous due to minor reasons.

As a method of detecting the deterioration of lithium-ion batteries to improve convenience of devices and to ensure safety of users, a method of providing a pressure sensor for detecting pressure caused by expansion of the lithium-ion battery, monitoring presence of deformation of the lithium-ion battery based on an output signal of the pressure sensor, and performing notification or warning to the user with respect to a deterioration state of the lithium-ion battery has been proposed (see Patent Document 1).

In addition, a method of continuously measuring pressure fluctuation of a secondary battery during charging at a microscopic time interval, comparing a differential of the pressure fluctuation with a threshold value, and issuing a warning, is proposed (see Patent Document 2).

However, the technique described in Patent Document 1 does not alert the user until the pressure of the lithium-ion battery reaches a threshold set by the manufacturer because the detected pressure is compared with a predetermined threshold. That is, even if a sign of a dangerous state appears, no warning will be given until the lithium-ion battery actually reaches a dangerous state.

In addition, in the technique described in Patent Document 2, because the timing of detecting the deformation amount of the battery is limited while the battery is charging, the deformation amount cannot be detected and a warning cannot be performed unless the deteriorated battery is charged.

As described above, the related art provides warnings and the like after a lithium-ion battery actually reaches a dangerous state, and it is impossible to give warning and the like beforehand until the lithium-ion battery reaches a dangerous state.

CITATION LIST

Patent Document

[Patent Document 1] Japanese Patent No. 5573169
[Patent Document 2] Japanese Laid-open Patent Application Publication No. 08-331769

SUMMARY OF THE INVENTION

According to an aspect of the present disclosure, there is provision of an electronic device including a deformation amount detecting unit configured to detect a deformation amount of a secondary battery connected to the electronic device; a total charge/discharge amount detecting unit configured to detect a total charge/discharge amount of the secondary battery; a storage unit configured to store reference data representing a relationship between the deformation amount and the total charge/discharge amount; a state determining unit configured to determine a state of the secondary battery, based on the deformation amount detected by the deformation amount detecting unit, the total charge/discharge amount detected by the total charge/discharge amount detecting unit, and the reference data; and a notification control unit configured to perform a notification based on a result of the state of the secondary battery.

DETAILED DESCRIPTION OF THE PREFERRED EMBODIMENTS

Figure 1:
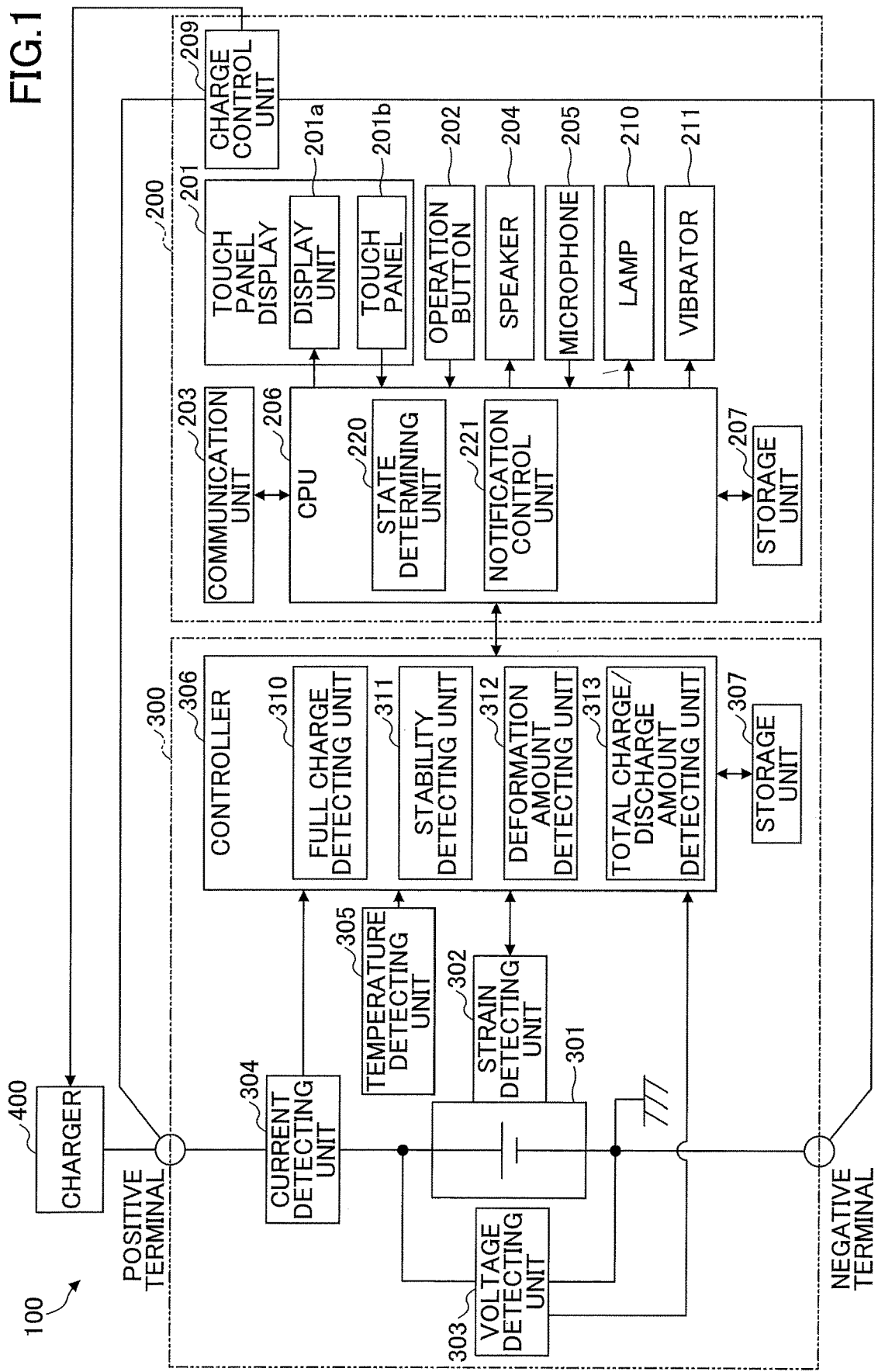
FIG. 1 is a block diagram illustrating a schematic configuration of an electronic device according to a first embodiment.

Hereinafter, embodiments of the present invention will be described with reference to the drawings. In each of the drawings, the same components are indicated by the same reference numerals and overlapping descriptions may be omitted.

In the embodiments described below, a smartphone is illustrated as an example of an electronic device to which the present invention is applied.

First Embodiment

Hereinafter, the electronic device according to a first embodiment of the present invention will be described.

Outline of Electronic Device

FIG. 1 is a diagram illustrating a schematic configuration of the electronic device 100 according to the first embodiment.

In FIG. 1, the electronic device 100 includes a main body 200 and a battery section 300 as a battery module. A charger 400 is connected to the battery section 300.

The main body 200 includes a touch panel display 201, an operation button 202, a communication unit 203, a speaker 204, a microphone 205, a CPU (Central Processing Unit) 206, a storage unit 207, a charge control unit 209, a lamp 210, and a vibrator 211.

The touch panel display 201 includes a display unit 201a and a touch panel 201b. The display unit 201a is overlaid with the touch panel 201b.

The display unit 201a may be a display device such as a liquid crystal display or an organic EL display.

When the touch panel 201b detects that an object such as a user's finger contacts a surface of the touch panel 201b, and detects the location contacted by the object such as a user's finger, the touch panel 201b transmits a detection signal to the CPU 206. A detection method of the touch panel 201b may be any types of methods, such as a capacitive method, a resistive method, a surface acoustic wave method, an infrared method, and a load detection method.

The operation button 202 is a button that accepts an operation input from a user. Examples of the operation button 202 include a power button and a volume button.

The communication unit 203 is, for example, a wireless communication module that performs radio communication.

The communication unit 203 supports communication standards such as 2G, 3G, 4G, and 5G, or short-range radio communication standards.

The speaker 204 outputs a sound signal sent from the CPU 206 as a sound. The speaker 204 outputs, for example, voice or music of video content played back on the electronic device 100, and voice of the other person on the phone. The microphone 205 converts the user's voice or the like that is captured by the microphone 205 into a sound signal, and transmits the sound signal to the CPU 206.

The CPU 206 is a main control unit that controls each portion of the main body 200 and the battery section 300. The CPU 206 executes instructions included in a program (computer program) stored in the storage unit 207 while referring to data stored in the storage unit 207 as necessary. The CPU 206 implements various functions based on the data and the instructions.

The storage unit 207 includes a memory such as a RAM (Random Access Memory) or a flash memory. The storage unit 207 stores various types of data such as setting data and detected data, and programs.

The charge control unit 209 is connected to a positive terminal and a negative terminal of the battery section 300, and controls the charger 400 based on voltage and current of the battery section 300, to charge a lithium-ion battery 301.

The lamp 210 is a light source such as a light emitting diode (LED), and provides a notification such as a charging status of the lithium-ion battery 301 and a warning, based on control by the CPU 206.

The vibrator 211 is a vibration motor that vibrates in accordance with control by the CPU 206, and vibrates when, for example, notifying a warning or the like.

The battery section 300 includes the lithium-ion battery 301, a strain detecting unit 302, a voltage detecting unit 303, a current detecting unit 304, a temperature detecting unit 305, a controller 306, and a storage unit 307.

The lithium-ion battery 301 is a secondary battery (rechargeable battery) that is formed by connecting multiple cells. Alternatively, the lithium-ion battery 301 may be a secondary battery that consists of a single cell. The lithium-ion battery 301 supplies power to each element of the battery section 300 and to the main body 200. That is, the main body 200 is a load device with respect to the lithium-ion battery 301.

The strain detecting unit 302 is a sensor that detects an amount of strain in the lithium-ion battery 301. For example, a strain gauge, which detects strain occurring in an object to be measured as a change in electrical resistance, may be used as the strain detecting unit 302. The change in the electrical resistance of the strain gauge is detected, for example, by converting the electrical resistance to voltage using a Wheatstone bridge.

Figure 2:
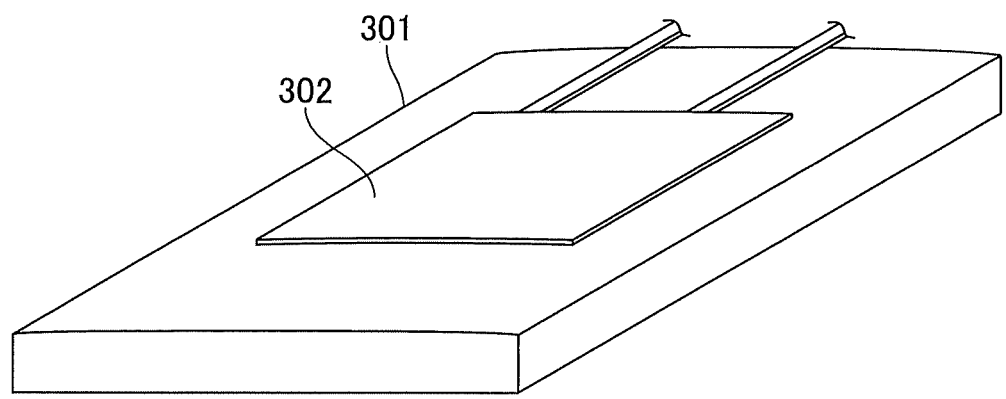
FIG. 2 is a diagram illustrating a lithium-ion battery to which a strain detecting unit is attached.

The strain detecting unit 302 is attached to the lithium-ion battery 301 with adhesive or the like. For example, as illustrated in FIG. 2, if the lithium-ion battery 301 is flat, the strain detecting unit 302 is attached to a surface of the lithium-ion battery 301.

The strain detecting unit 302 is not limited to a strain gauge, and may be a pressure sensor.

Returning to FIG. 1, the voltage detecting unit 303 detects voltage between the terminals of the lithium-ion battery 301, and outputs a detected value of the voltage (may also be referred to as a "voltage detection value") to the controller 306.

A current detecting unit 304 is disposed, for example, on a charging path between the lithium-ion battery 301 and the charger 400. The current detecting unit 304 has a detection resistor, and detects charging current and discharging current to output a detected value of the current (may also be referred to as a "current detection value") to the controller 306.

The controller 306 controls each element in the battery section 300. The controller 306 includes a processor (CPU), and the CPU executes instructions included in a program stored in the storage unit 307 while referring to data stored in the storage unit 307 as necessary. The controller 306 implements various functions based on the data and the instructions.

The temperature detecting unit 305 is a temperature sensor that detects a temperature of the lithium-ion battery 301 or the surroundings of the lithium-ion battery 301, and outputs the detected temperature value to the controller 306.

The storage unit 307 includes a memory such as a RAM or a flash memory. The storage unit 307 stores various types of data such as setting data and detected data, and programs.

[Functional Configuration of Electronic Device]

Next, functions implemented by the CPU 206 and the controller 306 will be described.

The controller 306 includes, for example, a full charge detecting unit 310, a stability detecting unit 311, a deformation amount detecting unit 312, and a total charge/discharge amount detecting unit 313.

While the lithium-ion battery 301 is being charged, the full charge detecting unit 310 detects whether the lithium-ion battery 301 is fully charged, based on the voltage detection value detected by the voltage detecting unit 303 and the current detection value detected by the current detecting unit 304.

After the lithium-ion battery 301 is fully charged and charging of the lithium-ion battery 301 is stopped, if an unloaded state or a load state of faint discharging continues, the output voltage of the lithium-ion battery 301 stabilizes. The output voltage of a battery just after full charge may be considered to be V1 (charge voltage), and the output voltage of the battery while an unloaded state or a load state of faint discharging continues may be considered to be V2 (open end voltage). When the difference (V1–V2) between the charge voltage and the open end voltage becomes almost constant, the difference (V1–V2) is referred to as overvoltage.

After the lithium-ion battery 301 is fully charged, the stability detecting unit 311 detects whether or not the lithium-ion battery 301 is in a stable state, based on the voltage detection value detected by the voltage detecting unit 303 and the current detection value detected by the current detecting unit 304.

The deformation amount detecting unit 312 detects a deformation amount of the lithium-ion battery 301 from when use of the lithium-ion battery 301 is started, based on an amount of strain of the lithium-ion battery 301 detected by the strain detecting unit 302. In the present specification, the deformation amount of the lithium-ion battery 301 from when use of the lithium-ion battery 301 is started is denoted by "P". The deformation of the lithium-ion battery 301 is caused by expansion due to degradation, or by external pressure. Note that the deformation amount P may be a value obtained by subtracting or averaging the strain value detected by the strain detecting unit 302. The deformation amount P may be obtained by weighting to a value detected by the strain detecting unit 302, based on a temperature detected by the temperature detecting unit 305.

The deformation amount detecting unit 312 periodically detects the deformation amount P, and records the deformation amount P into the storage unit 307. When the controller 306 receives, from the CPU 206, a command to retrieve the deformation amount P, the controller 306 transmits the deformation amount P recorded in the storage unit 307 to the CPU 206.

The total charge/discharge amount detecting unit 313 detects a total charge/discharge amount C, which is a sum of an amount of charge that is discharged since use of the lithium-ion battery 301 was started and an amount of charge that is charged since the use of the lithium-ion battery 301 was started, based on a current detection value of charge current and a current detection value of discharge current that are input from the current detecting unit 304 to the controller 306. Here, the amount of charge that is discharged is the amount of electric charge calculated by integrating the current discharged from the lithium-ion battery 301 with respect to time, and the amount of charge that is charged is the amount of electric charge calculated by integrating the current charged to the lithium-ion battery 301 with respect to time. In the following description, the amount of charge that is discharged and/or the amount of charge that is charged may be referred to as the charge/discharge amount. The total charge/discharge amount C may be treated as quantity of electricity, or may be replaced by a cycle count (i.e., the number of times of charge/discharge) that is conventionally used as a parameter indicating aging of a secondary battery.

The total charge/discharge amount detecting unit 313 periodically detects the total charge/discharge amount C, and records the total charge/discharge amount C into the storage unit 307. Upon receiving a command to retrieve the total charge/discharge amount C from the CPU 206, the controller 306 transmits the total charge/discharge amount C recorded in the storage unit 307 to the CPU 206.

The CPU 206 includes, for example, a state determining unit 220 and a notification control unit 221. The state determining unit 220 determines a state of the lithium-ion battery 301 based on a relationship between the total charge/discharge amount C of the lithium-ion battery 301 and the deformation amount P of the lithium-ion battery 301.

When deterioration or failure of the lithium-ion battery 301 is detected by the state determining unit 220, the notification control unit 221 controls the display unit 201a, the speaker 204, the lamp 210, the vibrator 211, and the like, to notify a user with a warning or the like. For example, the notification control unit 221 may notify the user by displaying a message on the display unit 201a, by voice notification using the speaker 204, by blinking the lamp 210, by vibration of the vibrator 211, or the like.

[State Determination Process]

Next, a state determination process performed by the state determining unit 220 will be described. In the present embodiment, the state determining unit 220 performs determination using a reference value, a threshold value, an upper limit value, and the like stored in the storage unit 207.

Figure 3:
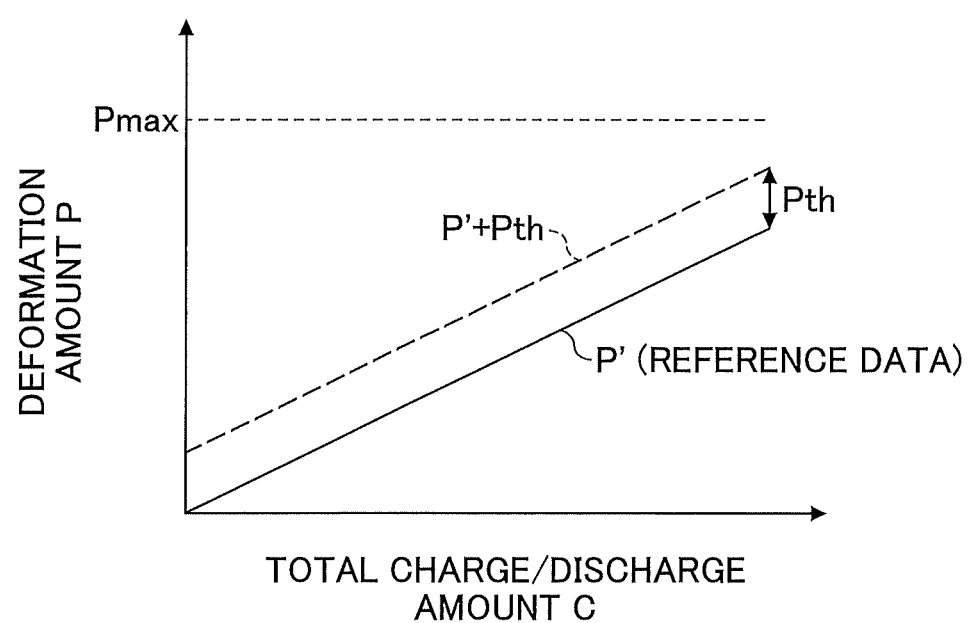
FIG. 3 is a diagram illustrating a reference value, a threshold value, and an upper limit value stored in a storage unit.

FIG. 3 is a diagram illustrating the reference value P', the threshold value Pth, and the upper limit value Pmax stored in the storage unit 207. The reference value P' represents the deformation amount P with respect to total charge/discharge amount C in an ideal lithium-ion battery.

The deformation amount P of a lithium-ion battery does not monotonically increase with time. The deformation amount P increases during charging, and decreases during discharging. In an ideal lithium-ion battery, there is a correlation between total charge/discharge amount C and the deformation amount P, and the deformation amount P tends to increase in accordance with increase in the total charge/discharge amount C. For example, multiple sets of the total charge/discharge amount C and the deformation amount P are observed by varying the total charge/discharge amount C, when a lithium-ion battery is in a stable state after the lithium-ion battery is fully charged in order that each deformation amount P can be compared. If the multiple sets of the total charge/discharge amount C and the deformation amount P are graphed, the graph indicates a substantially linear correlation, as illustrated in FIG. 3.

Because the correlation varies depending on individual differences in lithium-ion batteries or in the strain detecting units 302 for detecting the deformation amount P, the correlation is preferably modeled in advance based on multiple measured data obtained from multiple lithium-ion batteries, by acquiring a median value or an average value, or by performing zero point adjustment. In the storage unit 207, the modeled data is stored as reference data. The reference data represents a relationship between the total charge/discharge amount C and the reference value P'. The relationship between the total charge/discharge amount C and the reference value P' stored in the storage unit 207 is not limited to the linear relationship as illustrated in FIG. 3.

The threshold value Pth is used for deterioration determination by comparing the threshold value Pth with a difference ΔP between the deformation amount P and the reference value P'. The upper limit Pmax is used for deterioration determination that compares that upper limit Pmax with the deformation amount P.

Figure 4:
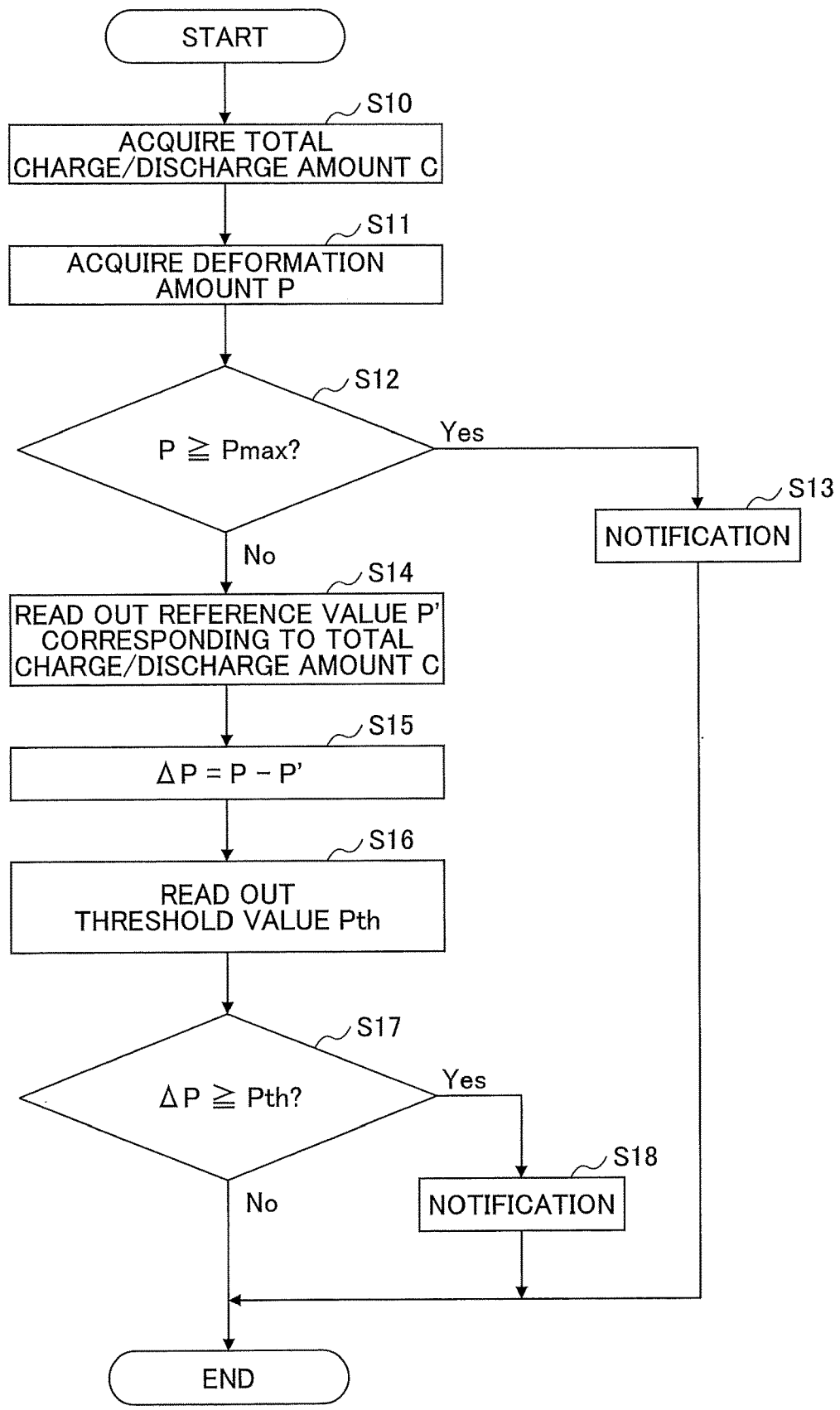
FIG. 4 is a flowchart illustrating a process flow of a state determination process performed by a state determining unit.

FIG. 4 is a flowchart illustrating a process flow of the state determination process performed by the state determining unit 220. The state determination process illustrated in FIG. 4 is performed, for example, when a stable state is detected by the stability detecting unit 311.

When the stability detecting unit 311 detects that the lithium-ion battery 301 is in a stable state, the state determining unit 220 acquires, from the controller 306, the total charge/discharge amount C detected by the total charge/discharge amount detecting unit 313 (step S10). At this time, in step S11, the state determining unit 220 acquires the deformation amount P detected by the deformation amount detecting section 312 from the controller 306.

Subsequently, the state determining unit 220 compares the acquired deformation amount P with the upper limit value Pmax stored in the storage unit 207, to determine whether or not the deformation amount P is equal to or greater than the upper limit value Pmax (step S12). If the deformation amount P is equal to or greater than the upper limit value Pmax (Yes in step S12), it is determined that a state of the lithium-ion battery 301 has reached a critical region (a dangerous deterioration state) in which ignition or explosion may occur. Thus, the notification control unit 221 notifies a user that the lithium-ion battery 301 is in the critical region by using the display unit 201a or the like (step S13).

Meanwhile, if the deformation amount P is less than the upper limit value Pmax (No in step S12), the state determining unit 220 reads out, from the storage unit 207, the reference value P' corresponding to the total charge/discharge amount C acquired in step S10 (step S14). In step S15, the state determining unit 220 calculates a difference ΔP based on the following equation (1).

$$\Delta P = P - P' \quad (1)$$

Next, in step S16, the state determining unit 220 reads out the threshold value Pth from the storage unit 207. In the present embodiment, the threshold value Pth is a fixed value that is independent of the total charge/discharge amount C.

In step S17, the state determining unit 220 compares the difference ΔP calculated in step S15 with the threshold value Pth, to determine whether or not the difference ΔP is equal to or greater than the threshold value Pth. If the difference ΔP is equal to or more than the threshold value Pth (Yes in step S17), it is determined that the lithium-ion battery 301 has reached a state requiring caution. Thus, the notification control unit 221 notifies the user that the lithium-ion battery 301 is in the state requiring caution, through the display unit 201a or the like (step S18).

Meanwhile, if the difference ΔP is less than the threshold value Pth (No in step S17), the state determining unit 220 terminates the state determination process.

Figure 5:
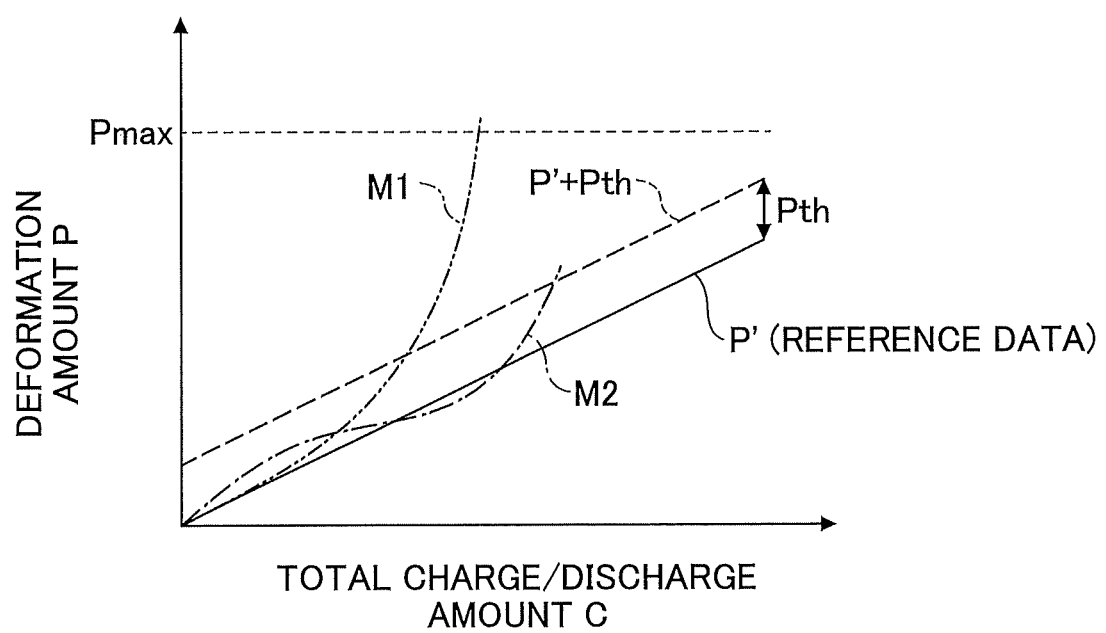
FIG. 5 is a diagram illustrating examples of measured results of a deformation amount.

A curve M1 and a curve M2 illustrated in FIG. 5 are examples of measurements of the deformation amount P. The curve M1 indicates a case in which the deformation amount P exceeded the upper limit value Pmax, meaning that the lithium-ion battery 301 was in the critical region. The curve M2 indicates a case in which the difference ΔP became equal to or greater than the threshold value Pth, meaning that the lithium-ion battery 301 was in the state requiring caution.

NOTIFICATION EXAMPLES

Next, examples of message notification to a user performed by the notification control unit 221 will be described.

Figure 6:
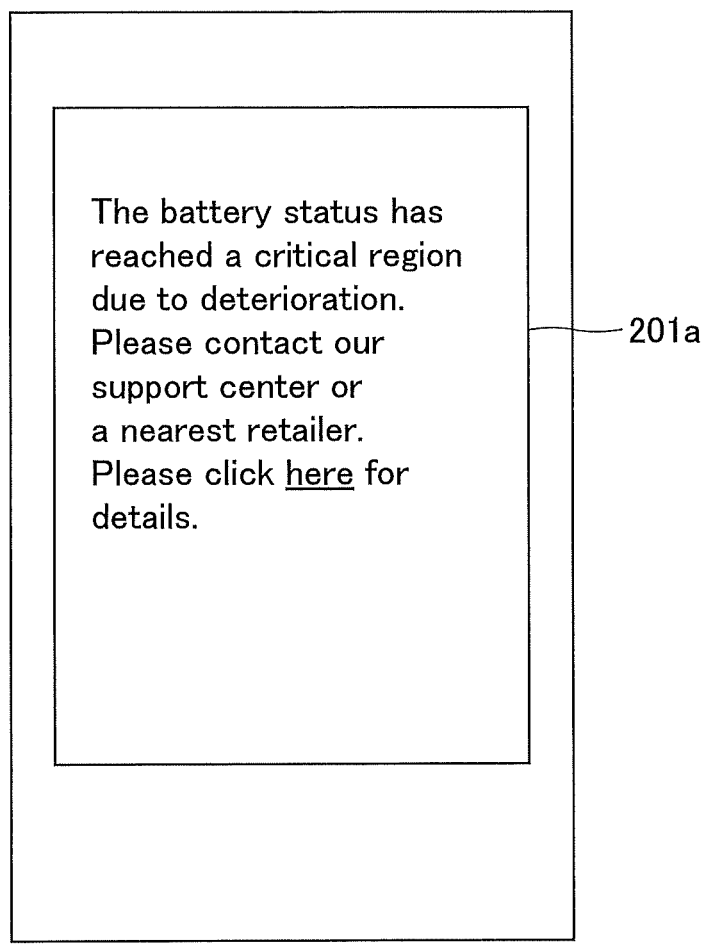
FIG. 6 is a diagram illustrating an example of a message displayed on a display unit.

FIG. 6 is a diagram illustrating an example of a message displayed on the display unit 201a in the above-described step S13 of FIG. 4. Because the lithium-ion battery 301 is in a dangerous deterioration state in a case in which step S13 is performed, the message illustrated in FIG. 6 includes a content indicating that a user needs to immediately contact a support center or the like. In addition, a hyperlink (underlined portion) is embedded in this message to communicate with the support center via the Internet.

Figure 7:
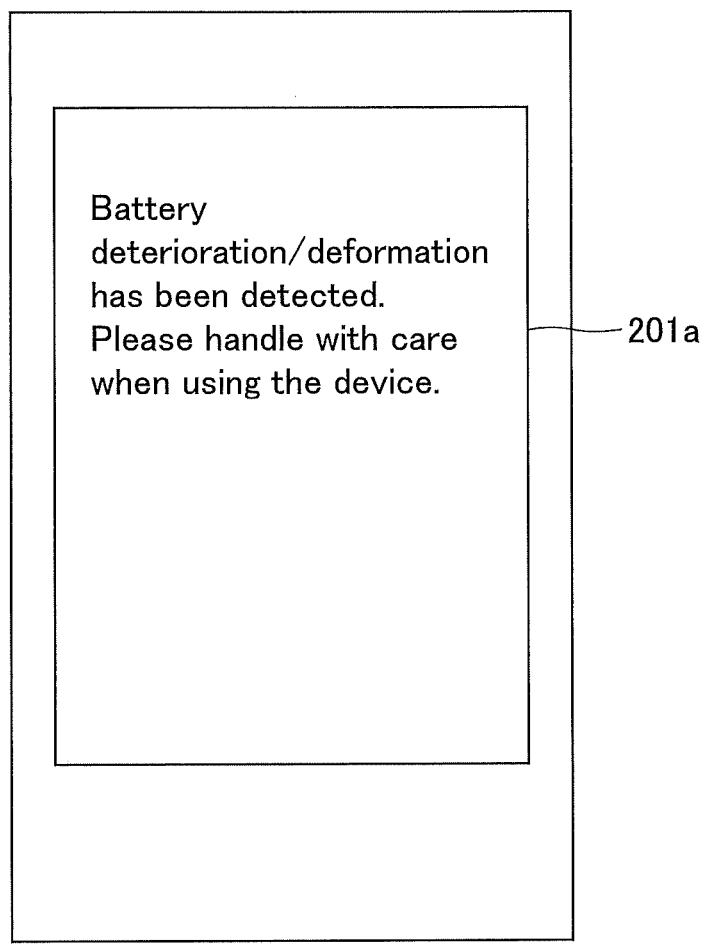
FIG. 7 is a diagram illustrating another example of a message displayed on the display unit.

FIG. 7 is a diagram illustrating an example of a message displayed on the display unit 201a in the above-described step S18 of FIG. 4. Because the lithium-ion battery 301 is in a state requiring caution in a case in which step S18 is performed, the message illustrated in FIG. 7 includes a content indicating that attention should be paid when handling the electronic devices hereafter.

In step S13 and step S18, in addition to displaying a message to the display unit 201a, the notification control unit 221 may perform notification through the speaker 204, the lamp 210, the vibrator 211, or the like.

As described above, according to the present embodiment, it is possible to send notify the user before the lithium-ion battery 301 reaches a dangerous state, thereby ensuring safety of the user.

Variation of First Embodiment

Figure 8:
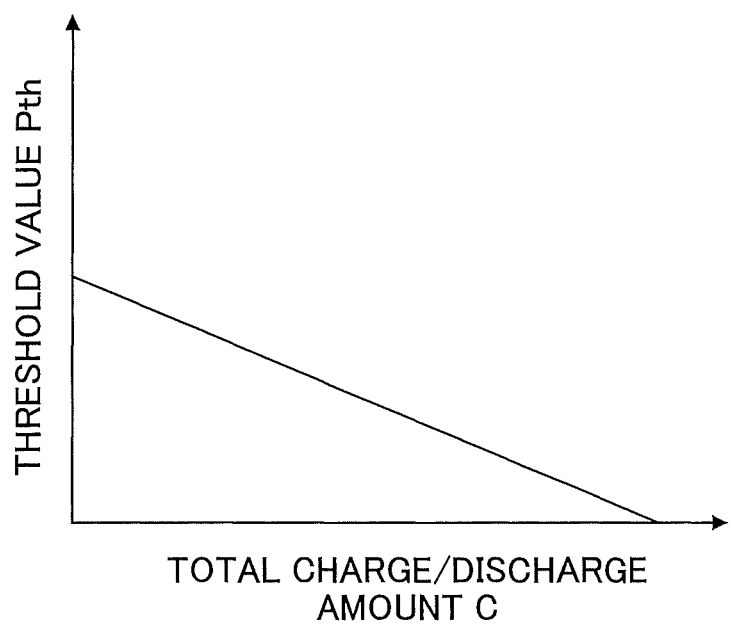
FIG. 8 is a diagram illustrating an example of a threshold value depending on a total charge/discharge amount.

Next, a variation of the first embodiment will be described. In the above-described first embodiment, the threshold value Pth is a fixed value. However, the threshold value Pth may be a value that varies depending on the total charge/discharge amount C. FIG. 8 is a diagram illustrating an example of a threshold value Pth that depends on the total charge/discharge amount C. The threshold value Pth illustrated in FIG. 8 decreases as the total charge/discharge amount C increases, and is stored in the storage unit 207 in a form of a function or a data table.

In the present variation, as the total charge/discharge amount C increases, the acceptable magnitude of the difference ΔP decreases. That is, the greater the total charge/discharge amount C, the more strictly the determination of the deterioration state using the threshold value Pth is performed.

Second Embodiment

Next, a second embodiment of the present invention will be described. In the second embodiment, a state determination process performed by the state determining unit 220 differs from that of the first embodiment. In the present embodiment, the state determining unit 220 determines a state of the lithium-ion battery 301 based on an amount of change in the deformation amount P per unit charge/discharge amount.

Hereinafter, a deformation amount at a given point in time (denoted by "n") of the lithium-ion battery 301 is denoted by $P_n$. A total charge/discharge amount from start of use of the lithium-ion battery 301 to the given point in time n is denoted by $C_n$.

An amount of change of the deformation amount $P_n$ per unit charge/discharge amount at the given point in time n may be referred to as an "amount of change $S_n$". The amount of change $S_n$ is expressed by the following equation (2).

$$S_n = (P_n - P_{n-1})/(C_n - C_{n-1}) \quad (2),$$

in which n is an integer greater than zero, $P_{n-1}$ and $C_{n-1}$ are the deformation amount and the total charge/discharge amount at a time of previous state determination.

In the present embodiment, the threshold value Sth to be compared with the amount of change $S_n$ is stored in the storage unit 207. The threshold value Sth is determined based on a slope of the reference data illustrated in FIG. 3. For example, the threshold value Sth may be obtained by adding, as a margin, a predetermined value to the slope of the reference data. Initial values $P_0$ and $C_0$ of the deformation amount $P_n$ and the total charge/discharge amount $C_n$ are stored in the storage unit 207 in advance.

Figure 9:
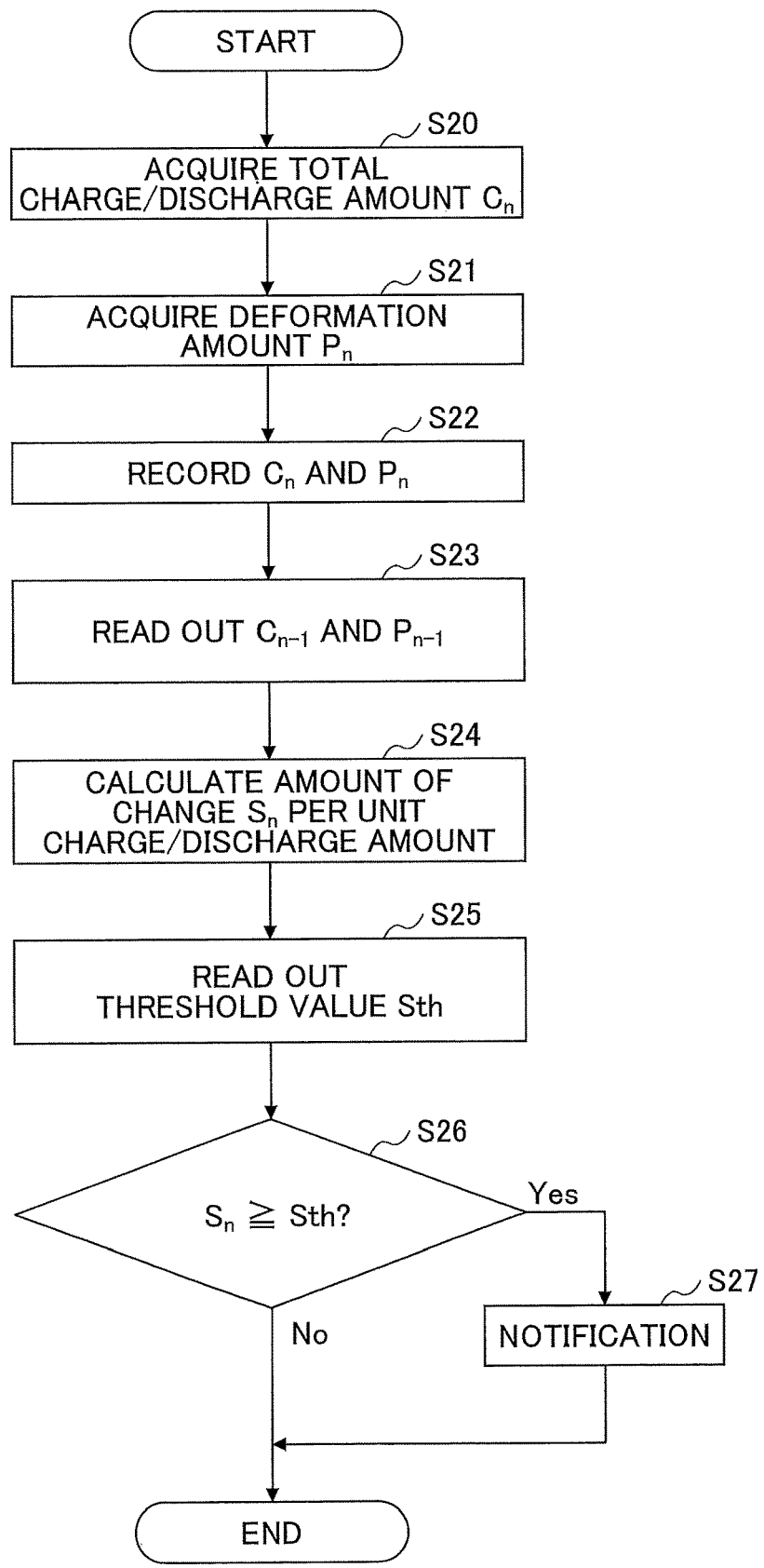
FIG. 9 is a flowchart illustrating a process flow of the state determination process according to a second embodiment.

FIG. 9 is a flowchart illustrating a process flow of the state determination process according to the second embodiment. The state determination process illustrated in FIG. 9 is performed, for example, when a stable state is detected by the stability detecting unit 311.

When the stability detecting unit 311 detects that the lithium-ion battery 301 is in a stable state, the state determining unit 220 acquires the total charge/discharge amount $C_n$ detected by the total charge/discharge amount detecting unit 313 from the controller 306 (step S20). At this time, the state determining unit 220 acquires the deformation amount $P_n$ detected by the deformation amount detecting section 312 from the controller 306 (step S21). In step S22, the state determining unit 220 records the acquired total charge/discharge amount $C_n$ and the deformation amount $P_n$ into the storage unit 207.

Subsequently, the state determining unit 220 reads out the total charge/discharge amount $C_{n-1}$ and the deformation amount $P_{n-1}$, which were recorded during previous execution of the state determination process, from the storage unit 207 (step S23), and calculates the amount of change $S_n$ of the deformation amount $P_n$ per unit charge/discharge amount based on the above-described equation (2) (step S24). In step S25, the state determining unit 220 reads out the threshold value Sth from the storage unit 207. In the present embodiment, the threshold value Sth is a fixed value that is independent of the total charge/discharge amount $C_n$.

In step S26, the state determining unit 220 compares the amount of change $S_n$ calculated in step S24 with the threshold value Sth, to determine whether or not the amount of change $S_n$ is equal to or greater than the threshold value Sth. If the amount of change $S_n$ is equal to or greater than the threshold value Sth (Yes in step S26), it is determined that the lithium-ion battery 301 has reached a state requiring caution. Thus, the notification control unit 221 notifies a user that the lithium-ion battery 301 is in the state requiring caution, through the display unit 201a or the like (step S27).

Meanwhile, if the amount of change $S_n$ is less than the threshold value Sth (No in step S26), the state determining unit 220 terminates the state determination process.

Figure 10:
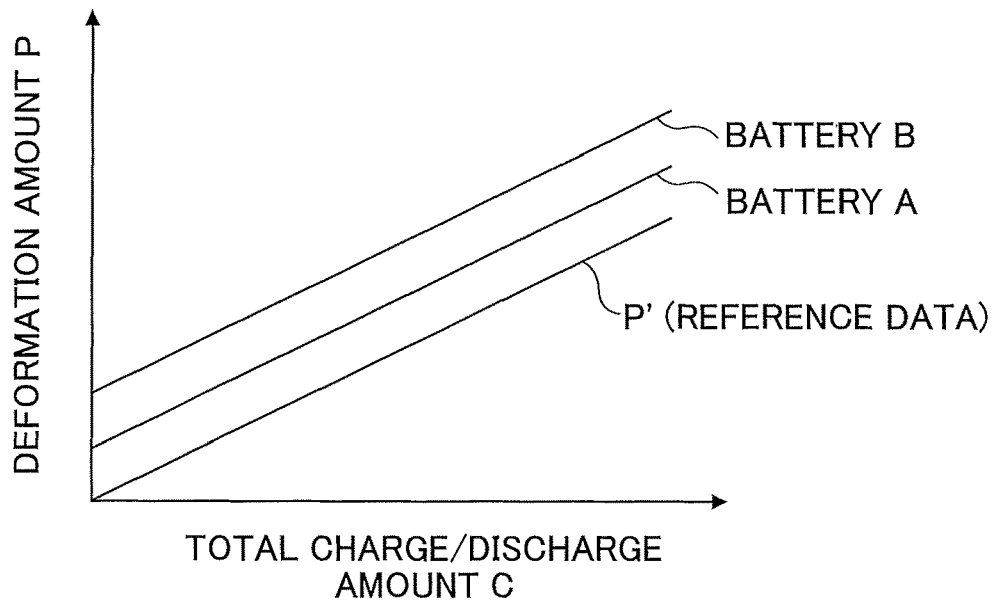
FIG. 10 is a diagram illustrating variations in deformation amount depending on individual differences in batteries.

As illustrated in FIG. 10, although the deformation amount P varies greatly depending on individual differences in batteries, a change rate (i.e., slope) of the deformation amount P is almost constant. Therefore, as in the present embodiment, if state determination is performed based on the amount of change $S_n$ of the deformation amount P rather than the deformation amount $P_n$ itself, incorrect determination due to individual differences in batteries can be reduced.

Variations of Second Embodiment

[First Variation]

Figure 11:
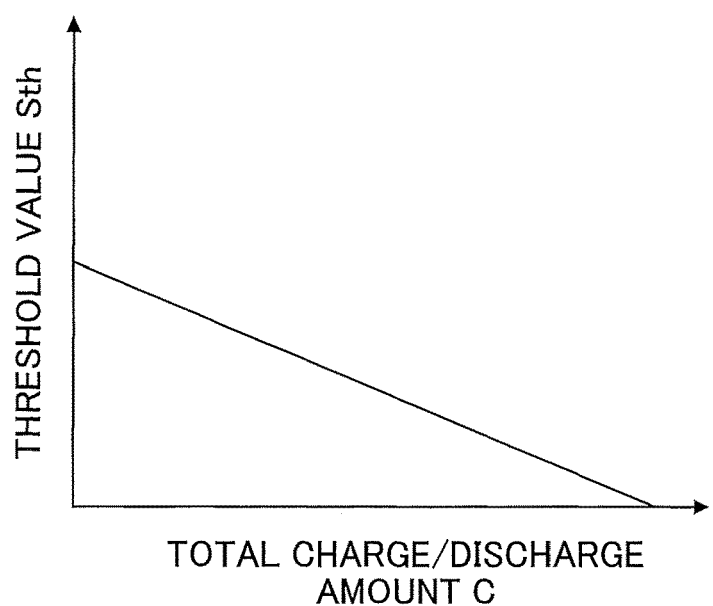
FIG. 11 is a diagram illustrating an example of a threshold value depending on the total charge/discharge amount.

In the above-described second embodiment, the threshold value Sth is a fixed value, but the threshold value Sth may be changed depending on the total charge/discharge amount C. FIG. 11 is a diagram illustrating an example of the threshold value Sth that depends on the total charge/discharge amount C. The threshold value Pth illustrated in FIG. 11 decreases as the total charge/discharge amount C increases, and is stored in a form of a function or a data table in the storage unit 207.

In a first variation of the second embodiment, as the total charge/discharge amount C increases, an acceptable magnitude of the amount of change $S_n$ decreases. That is, the larger the total charge/discharge amount C, the more strictly the determination of the deterioration state using the threshold value Sth is performed.

[Second Variation]

In the above-described second embodiment, because a difference between the total charge/discharge amount $C_n$ detected at a given point in time (time point n) and the total charge/discharge amount $C_{n-1}$ detected at a previous time point (time point (n−1)) is not always constant, the amount of change $S_n$ is calculated using the above-described equation (2). However, in a case in which the difference ($C_n - C_{n-1}$) can be regarded as being constant, determination may be made using a change amount $D_n$ calculated by the following equation (3).

$$D_n = P_n - P_{n-1} \quad (3)$$

In a case in which the above-described equation (3) can be used, because division processing of the above-described equation (2) can be omitted, calculation can be made with small computational complexity. Thus, the state determination process can be performed quickly.

Third Embodiment

Next, a third embodiment of the present invention will be described. In the third embodiment, a state determination process performed by the state determining unit 220 is different from the first and second embodiments. In the present embodiment, the state determining unit 220 determines a state of the lithium-ion battery 301 based on a rate of change of the above-described amount of change $S_n$. Note that the amount of change $S_n$ is the amount of change of the deformation amount $P_n$ per unit charge/discharge amount at the given point in time n, which has been described in the second embodiment.

In the following description, the rate of change of the amount of change $S_n$ at a given time point n is referred to as a rate of change $R_n$. The rate of change Rn is expressed by the following equation (4).

$$R_n = (S_n - S_{n-1})/(C_n - C_{n-1}) \quad (4),$$

in which n is an integer greater than zero. In addition, $S_{n-1}$ and $C_{n-1}$ are the change amount and the total charge/discharge amount at a time of previous state determination. That is, the rate of change $R_n$ is a change amount of $S_n$ per unit charge/discharge amount.

In the present embodiment, a threshold value Rth to be compared with the rate of change $R_n$ is stored in the storage unit 207. The threshold value Rth is determined based on the reference data illustrated in FIG. 3. Initial values $R_0$ and $C_0$ of the rate of change $R_n$ and the total charge/discharge amount $C_n$ are stored in advance in the storage unit 207.

Figure 12:
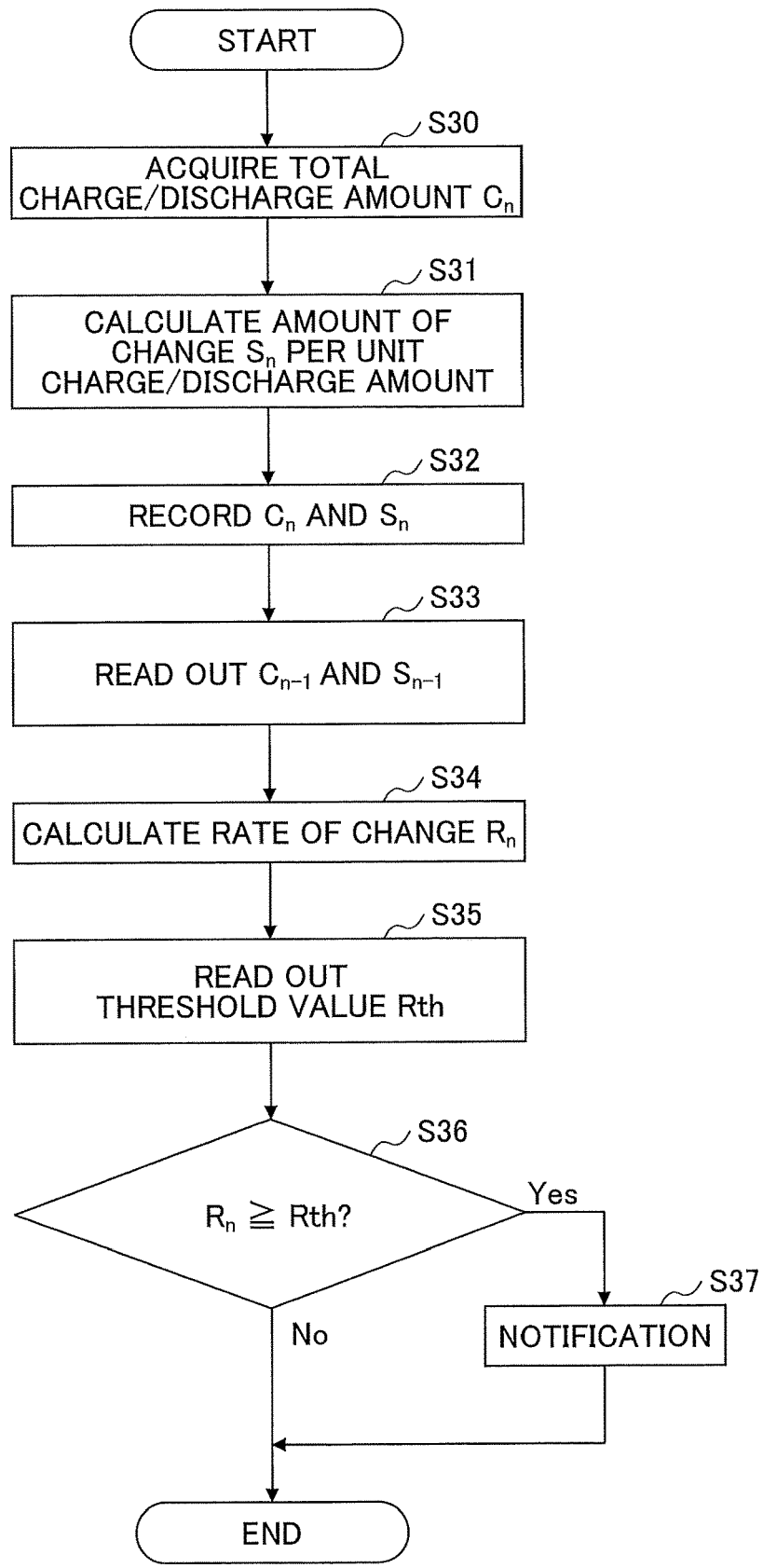
FIG. 12 is a flowchart illustrating a process flow of the state determination process according to a third embodiment.

FIG. 12 is a flowchart illustrating a process flow of the state determination process according to the third embodiment. The state determination process illustrated in FIG. 12 is performed when a stable state is detected by the stability detecting unit 311, for example.

When the stability detecting unit 311 detects that the lithium-ion battery 301 is in a stable state, the state determining unit 220 acquires the total charge/discharge amount $C_n$ detected by the total charge/discharge amount detecting unit 313 from the controller 306 (step S30). In step S31, the state determining unit 220 calculates the amount of change $S_n$ by performing the same steps as those in the second embodiment (steps S21 to S24). In step S32, the state determining unit 220 records the acquired total charge/discharge amount $C_n$ and the amount of change $S_n$ into the storage unit 207.

Next, the state determining unit 220 reads out the total charge/discharge amount $C_{n-1}$ and the amount of change $S_{n-1}$, which were recorded during previous execution of the state determination process, from the storage unit 207 (step S33), and calculates the rate of change $R_n$ based on the above-described equation (4) (step S34). In step S35, the state determining unit 220 reads out the threshold value Rth from the storage unit 207. In the present embodiment, the threshold value Rth is a fixed value that does not depend on the total charge/discharge amount $C_n$.

In step S36, the state determining unit 220 compares the rate of change $R_n$ calculated in step S34 with the threshold value Rth, to determine whether or not the rate of change $R_n$ is equal to or greater than the threshold value Rth. If the rate of change $R_n$ is equal to or greater than the threshold value Rth (Yes in step S36), it is determined that the lithium-ion battery 301 has reached a state requiring caution. Thus, the notification control unit 221 notifies a user that the lithium-ion battery 301 is in the state requiring caution, through the display unit 201a or the like (step S37).

Meanwhile, if the rate of change $R_n$ is less than the threshold value Rth (No in step S36), the state determining unit 220 terminates the state determination process.

In the present embodiment, because state determination is performed using the rate of change $R_n$, it is possible to quickly detect an indication of deformation caused by deterioration or the like of the lithium-ion battery 301.

Variations of Third Embodiment

[First Variation]

Figure 13:
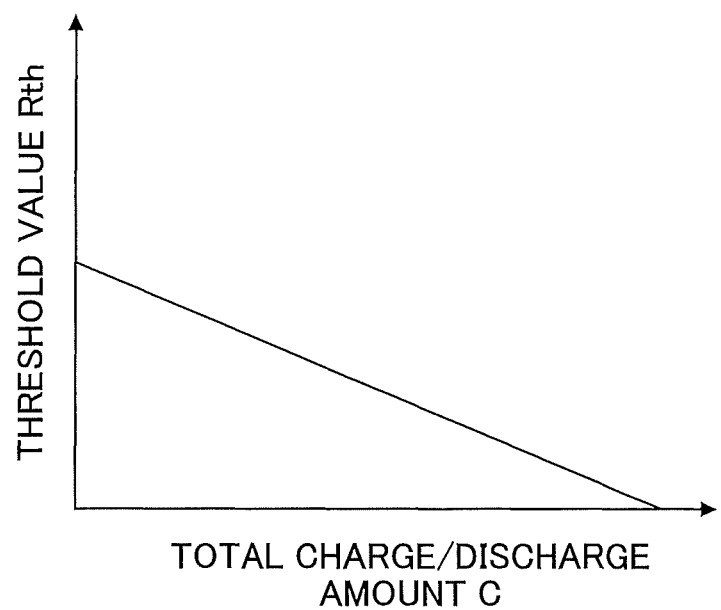
FIG. 13 is a diagram illustrating an example of a threshold value depending on the total charge/discharge amount.

In the above-described third embodiment, the threshold value Rth is a fixed value, but the threshold value Rth may be changed depending on the total charge/discharge amount C. FIG. 13 is a diagram illustrating an example of the threshold value Rth that depends on the total charge/discharge amount C. The threshold value Rth illustrated in FIG. 13 is decreased as the total charge/discharge amount C increases, and is stored in the storage unit 207 in the form of a function or a data table.

In a first variation of the third embodiment, as the total charge/discharge amount C increases, an acceptable magnitude of the rate of change $R_n$ decreases. That is, the greater the total charge/discharge amount C, the more strictly the determination of the deterioration state using the threshold value Rth is performed.

[Second Variation]

In the above-described third embodiment, because the difference between the total charge/discharge amount $C_n$ detected at a given point in time (time point n) and the total charge/discharge amount $C_{n-1}$ detected at a previous time point (time point (n−1)) is not always constant, the rate of change $R_n$ is calculated using the above-described equation (4). However, in a case in which the difference $(C_n - C_{n-1})$ can be regarded as being constant, determination may be made using a rate of change $DR_n$ calculated by the following equation (5).

$$DR_n = D_n - D_{n-1} \quad (5),$$

in which $D_n$ is the change amount defined by the equation (3) described in the second variation of the second embodiment. In a case in which the above-described equation (5) can be used, because division processing of the above-described equation (4) can be omitted, calculation can be made with small computational complexity. Thus, the state determination process can be performed quickly.

It should be noted that the state determination processes described in the first to third embodiments and in the various variations of the first to third embodiments may not only be used solely, but also be used in proper combination. As a method of the combination, the multiple state determination processes may be connected in series or in parallel. In addition, the sequence in which the steps for each of the state determination processes are executed is not limited to the above-described order, and the execution sequence may be changed to an extent that there is no conflict.

In each of the above-described embodiments, a current state of the lithium-ion battery 301 has been determined, but a future state can also be predicted. Hereinafter, embodiments in which a function to predict a future state of the lithium-ion battery 301 is added will be described.

Fourth Embodiment

Figure 14:
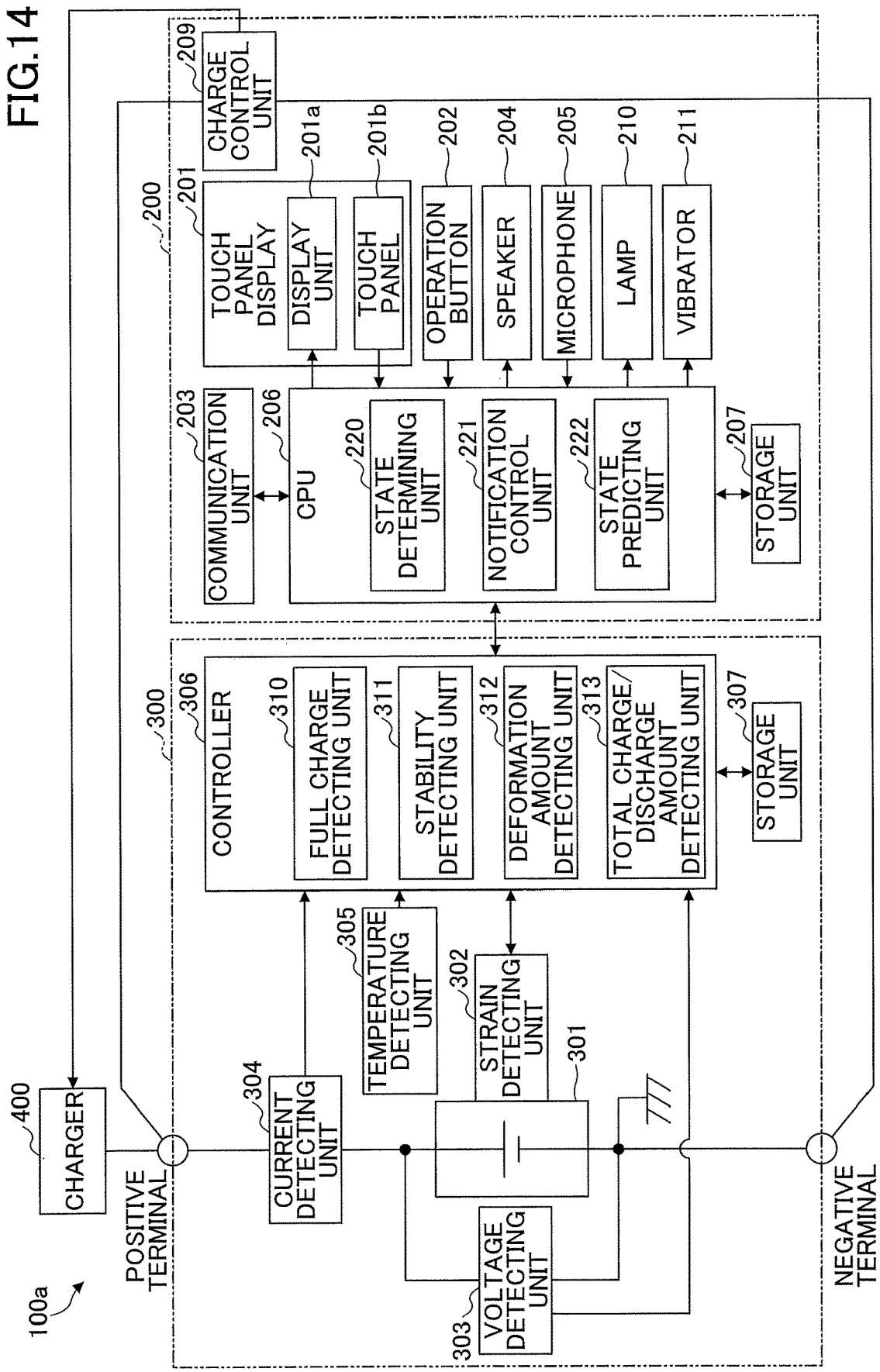
FIG. 14 is a diagram illustrating a schematic configuration of an electronic device according to a fourth embodiment.

FIG. 14 is a diagram illustrating a schematic configuration of an electronic device 100a according to a fourth embodiment. The configuration of the electronic device 100a according to the fourth embodiment differs from the configuration of the electronic device 100 according to the first embodiment only in that a state predicting unit 222 is added to the CPU 206.

Hereinafter, a state predicting process performed by the state predicting unit 222 will be described. According to the present embodiment, the state predicting unit 222 performs the state predicting process using parameters calculated in the state determination process performed by the above-described state determining unit 220.

Figure 15:
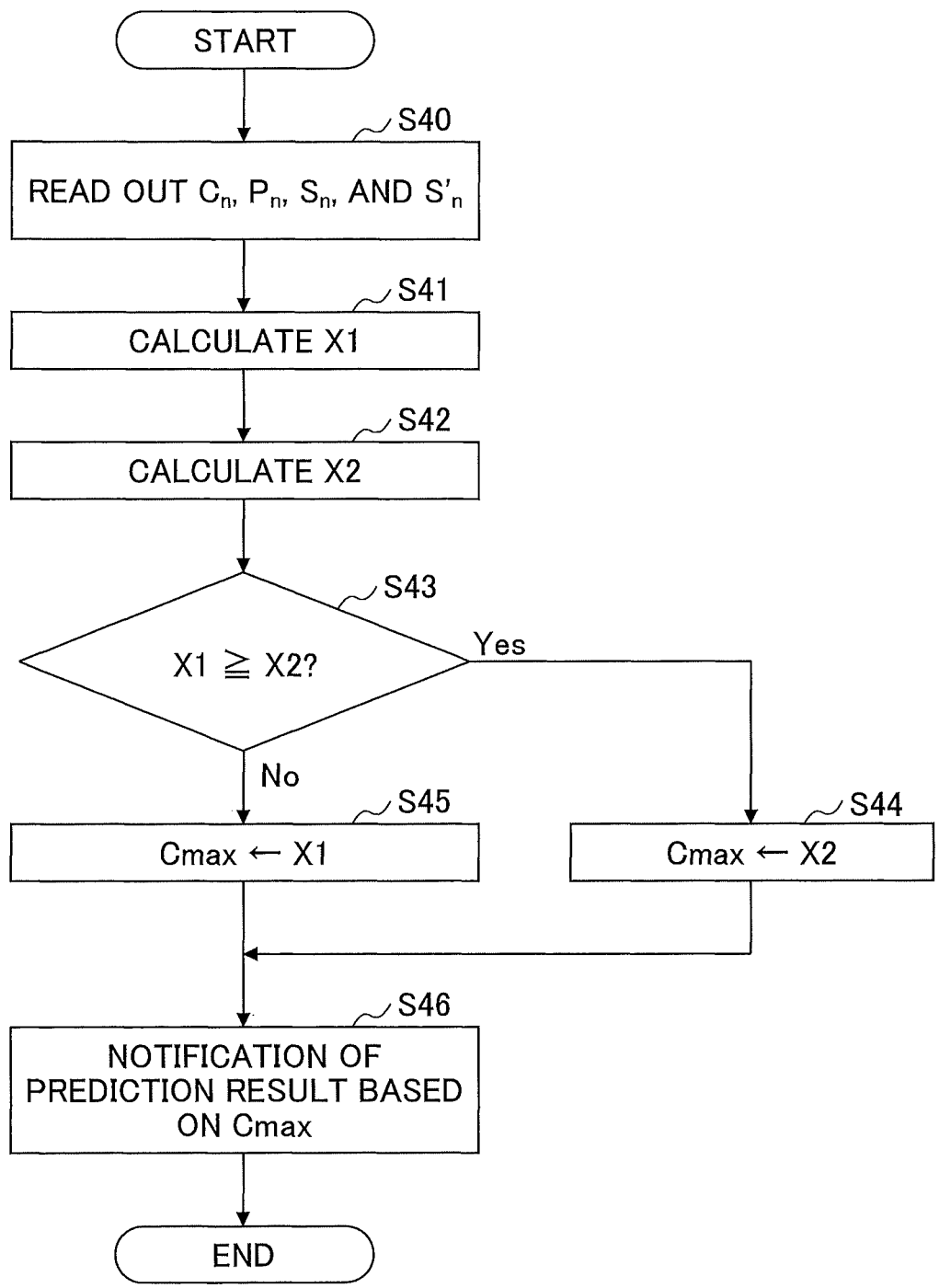
FIG. 15 is a flowchart illustrating a process flow of a state predicting process performed by a state predicting unit.

FIG. 15 is a flowchart illustrating a process flow of the state predicting process performed by the state predicting unit 222. The state predicting process illustrated in FIG. 15 is performed, for example, every time the state determining unit 220 according to the second or third embodiment performs the state determination process.

When the state determining unit 220 completes execution of the state determining process, the state predicting unit 222 reads out the total charge/discharge amount $C_n$, the deformation amount $P_n$, the amount of change $S_n$, and a reference change amount $S'_n$ that are recorded in the storage unit 207 (step S40). The reference change amount $S'_n$ is a rate of change in the reference value P', which is calculated based on the reference value P'. In other words, the reference change amount $S'_n$ corresponds to the slope of the reference data at a time point n.

Next, based on a function f(X) expressed by the following equation (6), the state predicting unit 222 obtains a value of X satisfying f(X)=Pmax (step S41). In the following description, the value of X satisfying f(X)=Pmax is denoted by "X1" (see FIG. 16).

$$f(X)=S_n \times (X-C_n)+P_n \qquad (6)$$

Subsequently, based on a function g(X) expressed by the following equation (7), the state predicting unit 222 obtains a value of X satisfying g(X)=Pmax (step S42). In the following description, the value of X satisfying g(X)=Pmax is denoted by X2 (see FIG. 16).

$$g(X)=S'_n \times (X-C_n)+P_n \qquad (7)$$

Next, in step S43, the state predicting unit 222 determines whether or not X1 is equal to or greater than X2. If X1 is equal to or greater than X2 (Yes in step S43), the state predicting unit 222 stores X2 to a parameter variable Cmax (step S44). Meanwhile, if X1 is less than X2 (No in step S43), the state predicting unit 222 stores X1 into the parameter variable Cmax (step S45).

In step S46, the notification control unit 221 performs notification of the result of the prediction based on the parameter variable Cmax. The result of the prediction may be, for example, a minimum charge/discharge amount that will be required until the deformation amount $P_n$ reaches the upper limit Pmax, or may be a time from the current time that will be required until the deformation amount $P_n$ reaches the upper limit Pmax.

Figure 16:
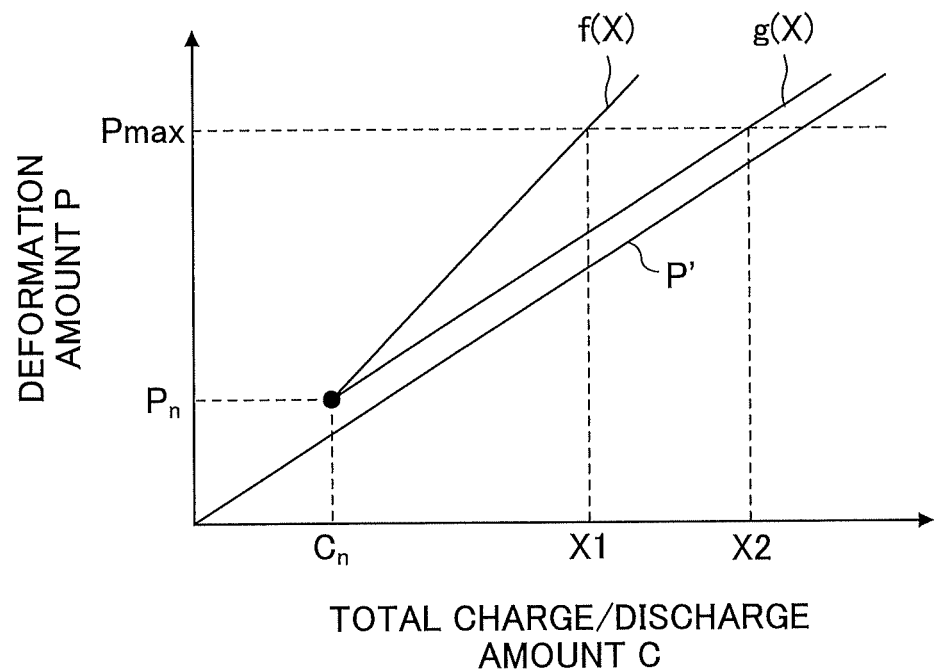
FIG. 16 is a diagram explaining a concept of a calculation method of X1 and X2 based on functions f(X) and g(X)

FIG. 16 is a diagram explaining a concept of a calculation method of X1 and X2 based on the function f(X) and the function g(X).

Example of Notification

Next, an example of notification of the prediction result according to the present embodiment will be described.

Figure 17:
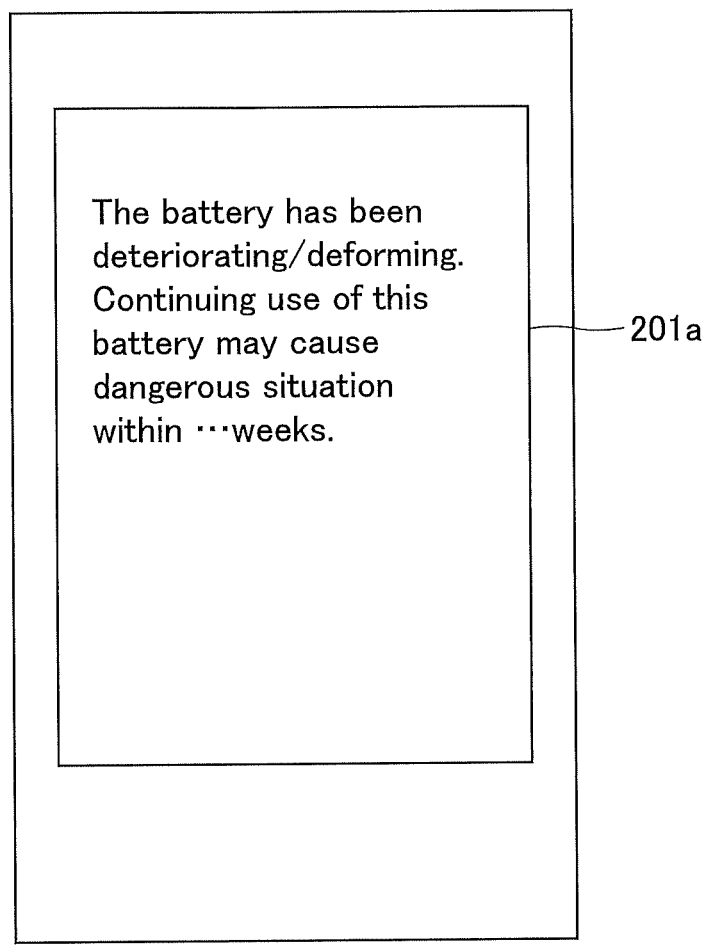
FIG. 17 is a diagram illustrating an example of a message displayed on the display unit.

FIG. 17 is a diagram illustrating an example of a message displayed on the display unit 201a when the above-described step S46 is performed. FIG. 17 illustrates an example of notifying the prediction result in a form of time (e.g., days, weeks, months).

Specifically, by dividing a difference between the total charge/discharge amount $C_n$ at the current time and Cmax by the charge/discharge amount per unit time (note that the charge/discharge amount per unit time is stored in the storage unit 207 or the like in advance), it is possible to calculate a remaining time until the deformation amount $P_n$ reaches the upper limit value Pmax. This allows a user to know in advance how safely the electronic device can be used hereafter.

Variations of Fourth Embodiment

[First Variation]

Similar to the second variation of the second embodiment, in a case in which the difference ($C_n-C_{n-1}$) between the total charge/discharge amount $C_n$ and the total charge/discharge amount $C_{n-1}$ can be regarded as being constant, it is possible to replace the amount of change $S_n$ with the change amount $D_n$. Similarly, the reference change amount $S'_n$ can be replaced with a reference change $D'_n$ expressed by the following equation (8).

$$D'_n=P'_n-P'_{n-1} \qquad (8)$$

[Second Variation]

In the fourth embodiment, the state predicting process is performed based on the total charge/discharge amount $C_n$, the deformation amount $P_n$, the amount of change $S_n$, and the reference change $S'_n$. However, the state predicting process can be performed using the total charge/discharge amount $C_n$, the amount of change $S_n$, the reference change amount $S'_n$, the rate of change $R_n$, and a reference change rate $R'_n$. In this case, the state predicting unit 222 may use functions F(X) and G(X) expressed by the following equations (9) and (10) respectively, instead of the functions f(X) and g(X).

$$F(X)=R_n \times (X-C_n)+S_n \qquad (9)$$

$$G(X)=R'_n \times (X-C_n)+S'_n \qquad (10)$$

Note that the reference change rate $R'_n$ is expressed by the following equation (11).

$$R'_n=(S'_n-S'_{n-1})/(C_n-C_{n-1}) \qquad (11)$$

The state predicting unit 222 may obtain a value of X satisfying F(X)=Smax, and may use the value of X satisfying F(X)=Smax as "X1". Note that "Smax" is an upper limit of the amount of change S. Similarly, the state predicting unit 222 may obtain a value of X satisfying G(X)=Smax, and may use the value of X satisfying G(X)=Smax as "X2".

[Third Variation]

In a case in which the difference ($C_n-C_{n-1}$) between the total charge/discharge amount $C_n$ and the total charge/discharge amount $C_{n-1}$ can be regarded as being constant in the second variation of the fourth embodiment, the rate of change $R_n$ and the reference change rate $R'_n$ respectively can be replaced with the change rate $DR_n$ expressed by the above-described equation (5) and with a reference rate $DR'_n$ expressed by the following equation (12).

$$DR'_n=D'_n-D'_{n-1} \qquad (12)$$

Fifth Embodiment

Next, a fifth embodiment of the present invention will be described. The electronic device according to the fifth embodiment differs from the electronic device according to the fourth embodiment only in the calculation method of the aforementioned X1 and X2 performed by the state predicting unit 222. Specifically, in the fourth embodiment, the upper limit value Pmax, which is a fixed value, is used for determining the X1 and X2. That is, a value of X satisfying f(X)=Pmax, is used as X1, and a value of X satisfying g(X)=Pmax, is used as X2. In the fifth embodiment, X1 and X2 are calculated by using a determination function whose output varies depending on the total charge/discharge amount C, instead of the upper limit value Pmax.

Figure 18:
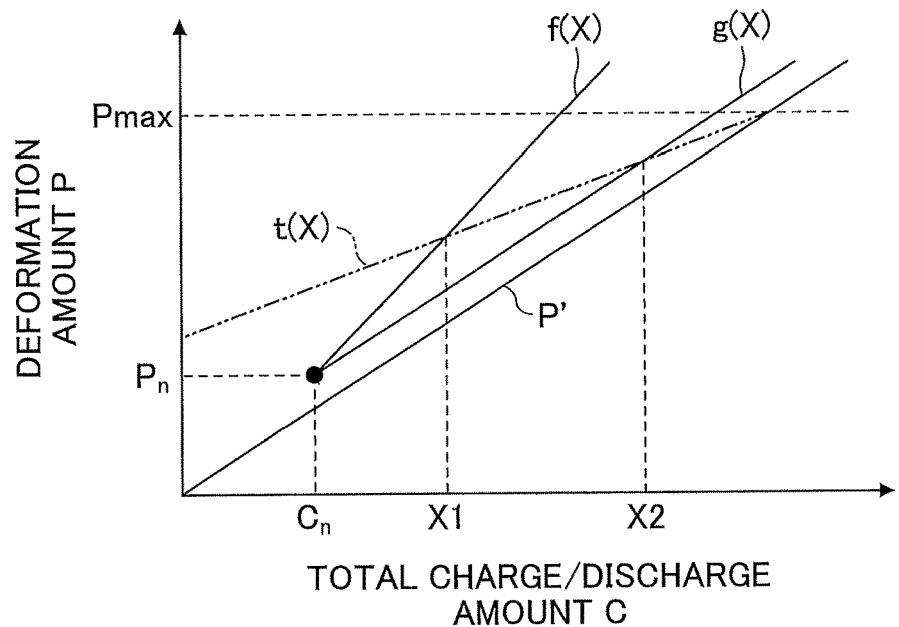
FIG. 18 is a diagram explaining a concept of a calculation method of X1 and X2 according to a fifth embodiment.

FIG. 18 is a diagram explaining a concept of a calculation method of the X1 and the X2 according to the fifth embodiment. In the present embodiment, the determination function $t(X)$ is used to calculate the X1 and the X2. The function $t(X)$ may be defined by, for example, summing the reference data described in the first embodiment (FIG. 3) and the threshold Pth illustrated in FIG. 8, and an output of the function $t(X)$ approaches the reference value P' as the total charge/discharge amount C increases.

The state predicting process according to the present embodiment differs from the state predicting process according to the third embodiment only in steps S41 and S42 illustrated in FIG. 15. In the present embodiment, a value of X satisfying $f(X)=t(X)$ is used as X1 in the fifth embodiment, and a value of X satisfying $g(X)=t(X)$ is used as X2 in the fifth embodiment.

With respect to the present embodiment, the variations of the fourth embodiment may also be applied.

Sixth Embodiment

A sixth embodiment will be described. The sixth embodiment relates to the second variation of the above-described fourth embodiment. In the second modification of the fourth embodiment, the functions $F(X)$ and $G(X)$ and the upper limit value Smax, which is a fixed value, are used in determining the X1 and X2. The X1 is determined by calculating a value of X satisfying $F(X)=Smax$, and the X2 is determined by calculating a value of X satisfying $G(X)=Smax$. In the sixth embodiment, X1 and X2 are calculated by using a determination function that varies depending on the total charge/discharge amount C, instead of the upper limit value Smax.

Figure 19:
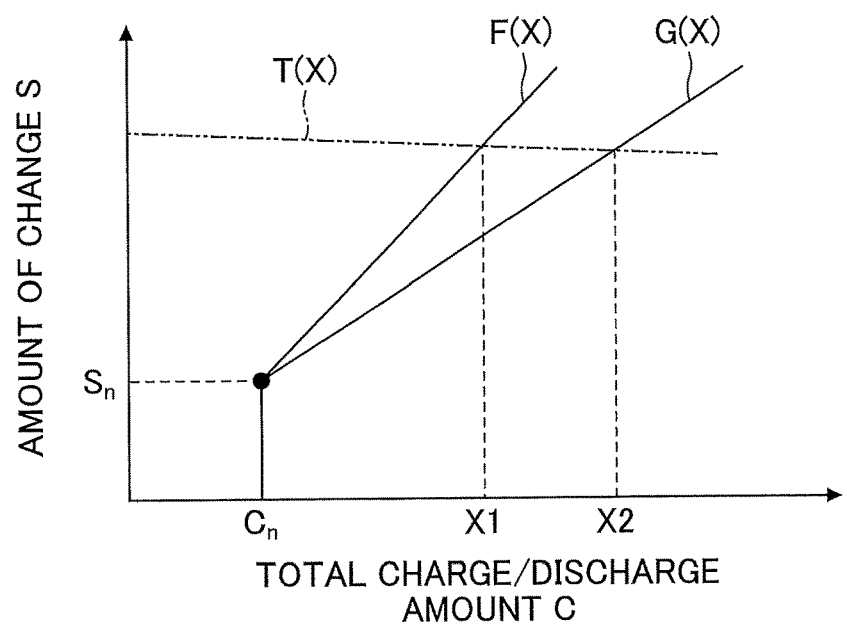
FIG. 19 is a diagram explaining a concept of a calculation method of X1 and X2 according to a sixth embodiment.

FIG. 19 is a diagram explaining a concept of a calculation method of the X1 and the X2 according to the sixth embodiment. In the present embodiment, a determination function $T(X)$ is used to calculate the X1 and the X2. Specifically, similar to the fifth embodiment, the value of X satisfying $F(X)=T(X)$ is used as X1 in the sixth embodiment, and the value of X satisfying $G(X)=T(X)$ is used as X2 in the sixth embodiment. The function $T(X)$ can be set based on the reference data.

With respect to the present embodiment, the variation (third variation) of the fourth embodiment may also be applied.

<Variations of Notification Method>

Next, variations of the notification method will be described. Notification of a result of state determination performed by the state determining unit 220 and a result of state prediction performed by the state predicting unit 222 can be made at an appropriate time immediately after the state determination or the state prediction. For example, the notification may be made when a usage time of an electronic device has reached or exceeded a predetermined period of time, or when an amount of increase in the total charge/discharge amount has reached or exceeded a predetermined amount. Alternatively, the notification may be made based on a schedule (e.g., weekly or daily).

The notification of the result of the state prediction may also be performed when a remaining usable time of the electronic device becomes less than a predetermined condition (e.g., one week or one month). Note that the condition is not limited to a time-related condition. For example, the number of times of charging may be used as the condition.

Figure 20:
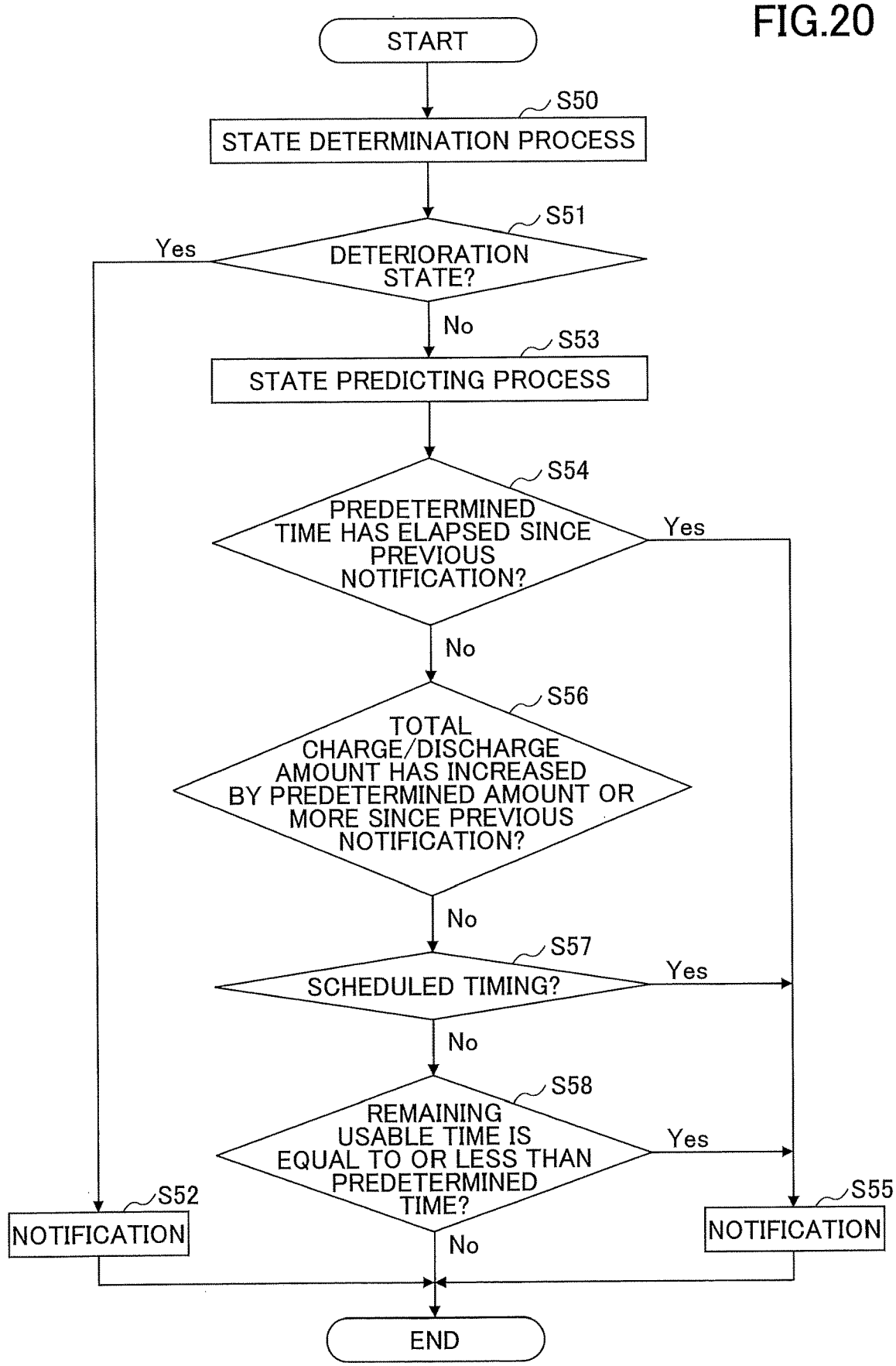
FIG. 20 is a flowchart illustrating an example of a notification method when results of state determination and state prediction are notified.

FIG. 20 is a flowchart illustrating an example of a notification method when the notification of the results of the state determination and the state prediction is performed. In FIG. 20, first, the state determining unit 220 performs any one of the above-described state determination processes (step S50), and when it is detected that the lithium-ion battery 301 is in a deterioration state (for example, when the lithium-ion battery 301 is in a critical region) (Yes in step S51), notification is performed by the notification control unit 221 (step S52). This notification performed in step S52 is similar to the notification of step S18 illustrated in FIG. 4.

Meanwhile, when a deterioration state is not detected (No in step S51), any one of the state predicting processes described above is performed by the state predicting unit 222 (step S53). Then, the notification control unit 221 determines whether or not a predetermined time has elapsed since previous notification of the result of state prediction (step S54). If the predetermined time has elapsed since the previous notification (Yes in step S54), the notification control unit 221 performs notification (step S55). This notification is similar to the notification of step S46 illustrated in FIG. 15.

Meanwhile, if the predetermined time has not elapsed since the previous notification (No in step S54), the notification control unit 221 determines whether or not the total charge/discharge amount has increased by a predetermined amount or more since the previous notification of the result of state prediction (step S56). If the total charge/discharge amount has increased by the predetermined amount or more (Yes in step S56), the notification control unit 221 performs notification (in step S55).

Meanwhile, if the total charge/discharge amount has not increased by the predetermined amount or more (No in step S56), the notification control unit 221 determines whether or not the current time is a scheduled timing (for example, once a week or once a month) (step S57), and if it is the scheduled timing (Yes in step S57), the notification control unit 221 performs notification (in step S55).

Meanwhile, when it is not the scheduled timing (No in step S57), the notification control unit 221 determines whether or not a remaining usable time of the lithium-ion battery 301 is equal to or less than a predetermined time (step S58). If the remaining usable time is equal to or less than the predetermined time (step S58: Yes), the notification control unit 221 performs notification (step S55). Meanwhile, if the remaining usable time is not equal to or less than the predetermined time (No in step S58), the process ends.

Figure 21B:
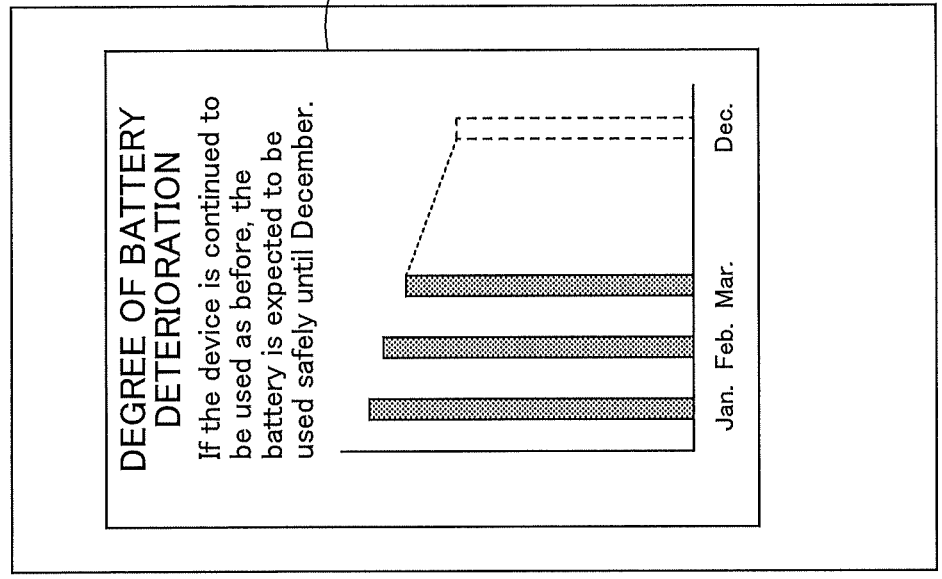
FIGS. 21A and 21B illustrate other notification examples of a result of state prediction.
Figure 21A:
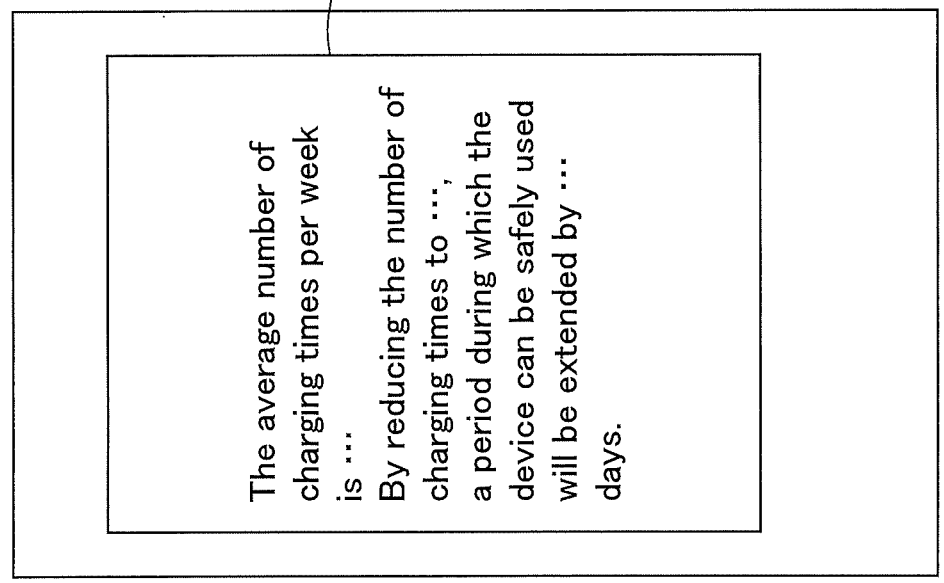

FIGS. 21A and 21B illustrate other notification examples of a result of state prediction. In FIG. 21A, the notification control unit 221 displays a past charging frequency and displays advice related to a future charging frequency. In FIG. 21B, the notification control unit 221 graphically displays degrees of deterioration of the battery in the past and a prediction of degrees of deterioration in the future. A user can reduce the number of times of charging of a battery, and can reduce deterioration of the battery in accordance with these indications.

Figure 22A:
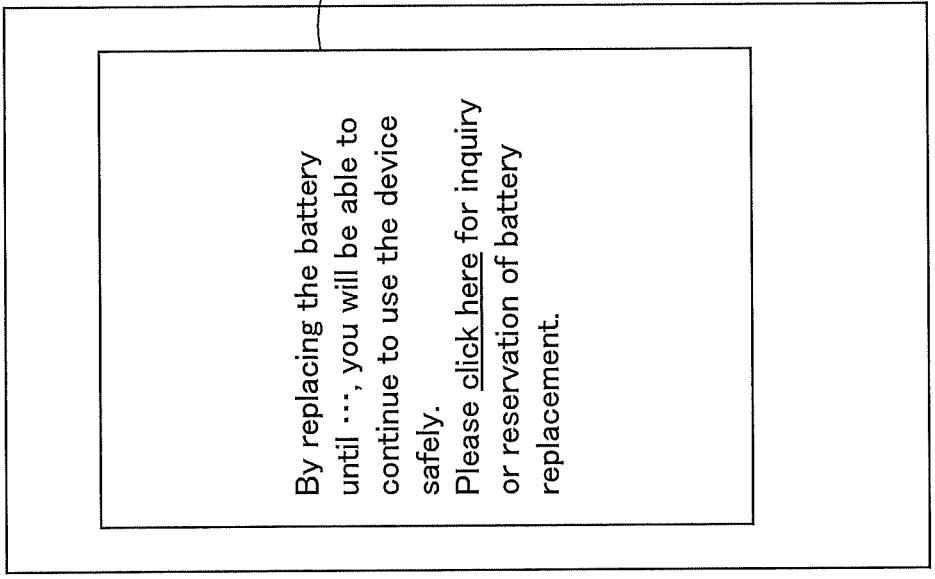
FIG. 22A and FIG. 22B illustrate examples of notifications that are notified in addition to a result of state prediction.
Figure 22B:
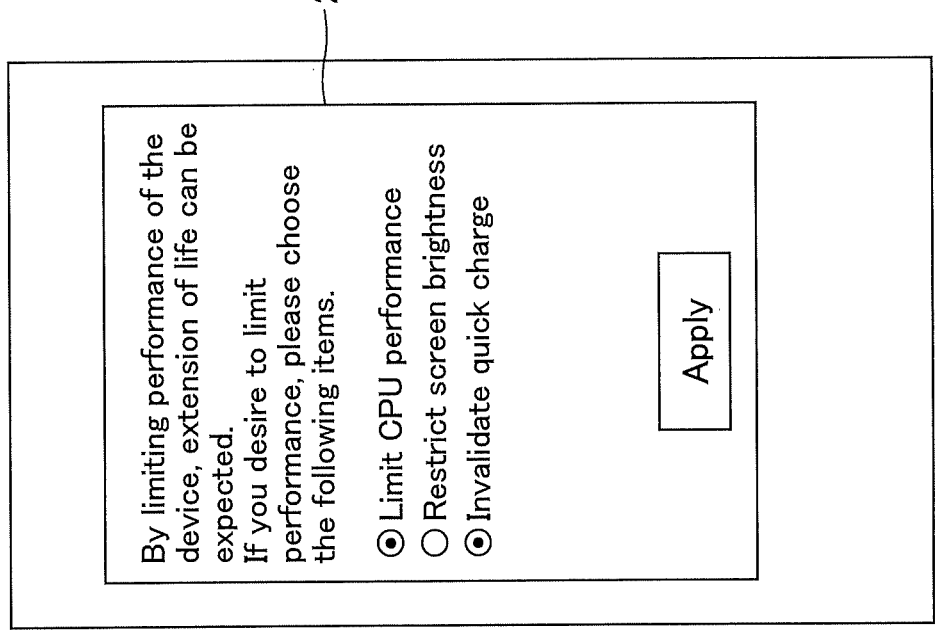

FIG. 22A and FIG. 22B illustrate examples of notifications that are notified in addition to a result of state prediction. In FIG. 22A, the notification control unit 221 displays a proposal for changing a mode of the electronic device for extending a life of the lithium-ion battery 301. Examples of the proposal may include reduction of CPU performance or the like to reduce current consumption, and reduction in charging speed. In FIG. 22B, the notification control unit 221 displays a proposal for replacing the lithium-ion battery 301 and a guide for maintenance service.

<Supplement>

Below is a supplementary explanation of a full charge detecting process and a stable state detecting process.

[Full Charge Detecting Process]

Figure 23:
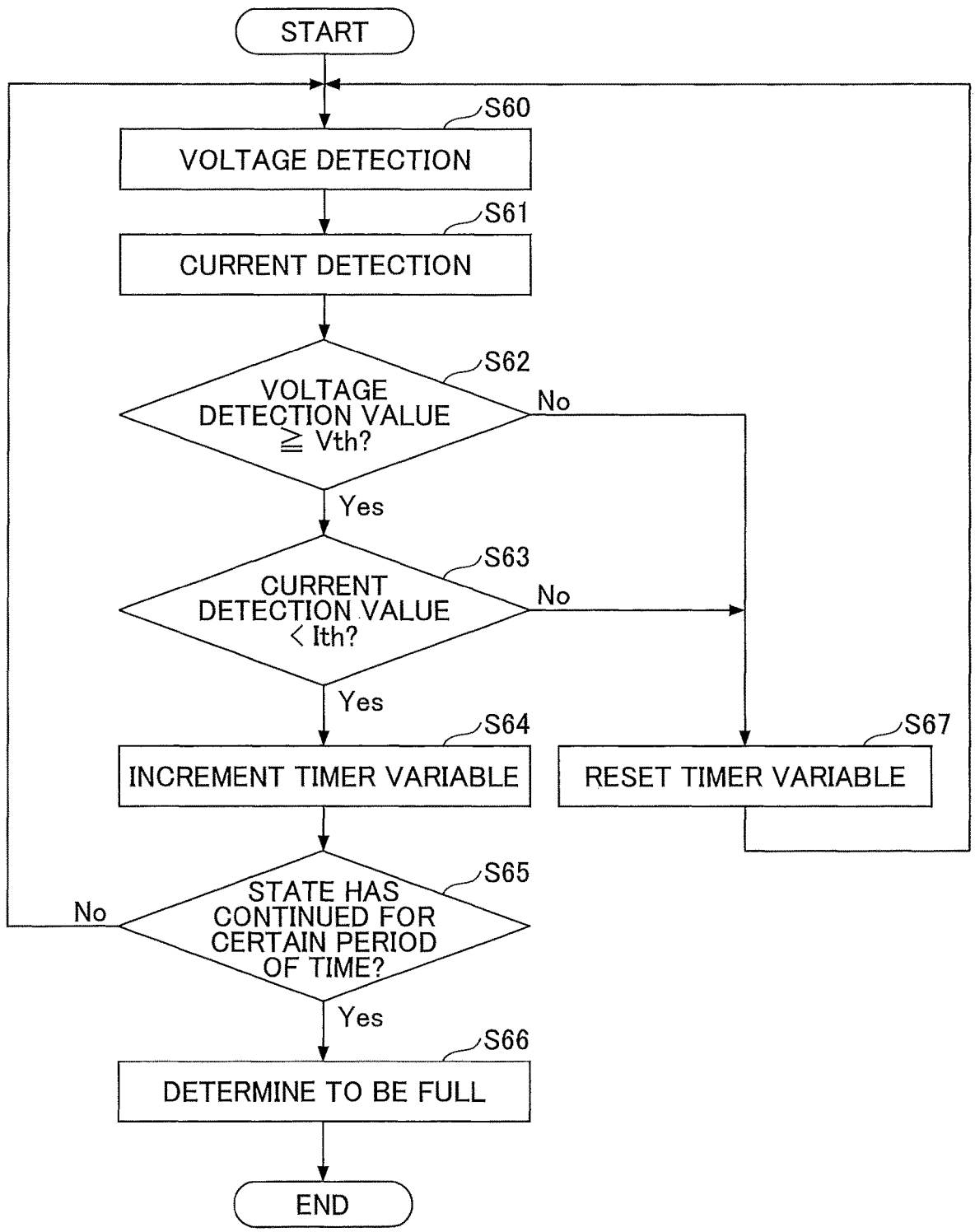
FIG. 23 is a flowchart illustrating a full charge detecting process.
Figure 24:
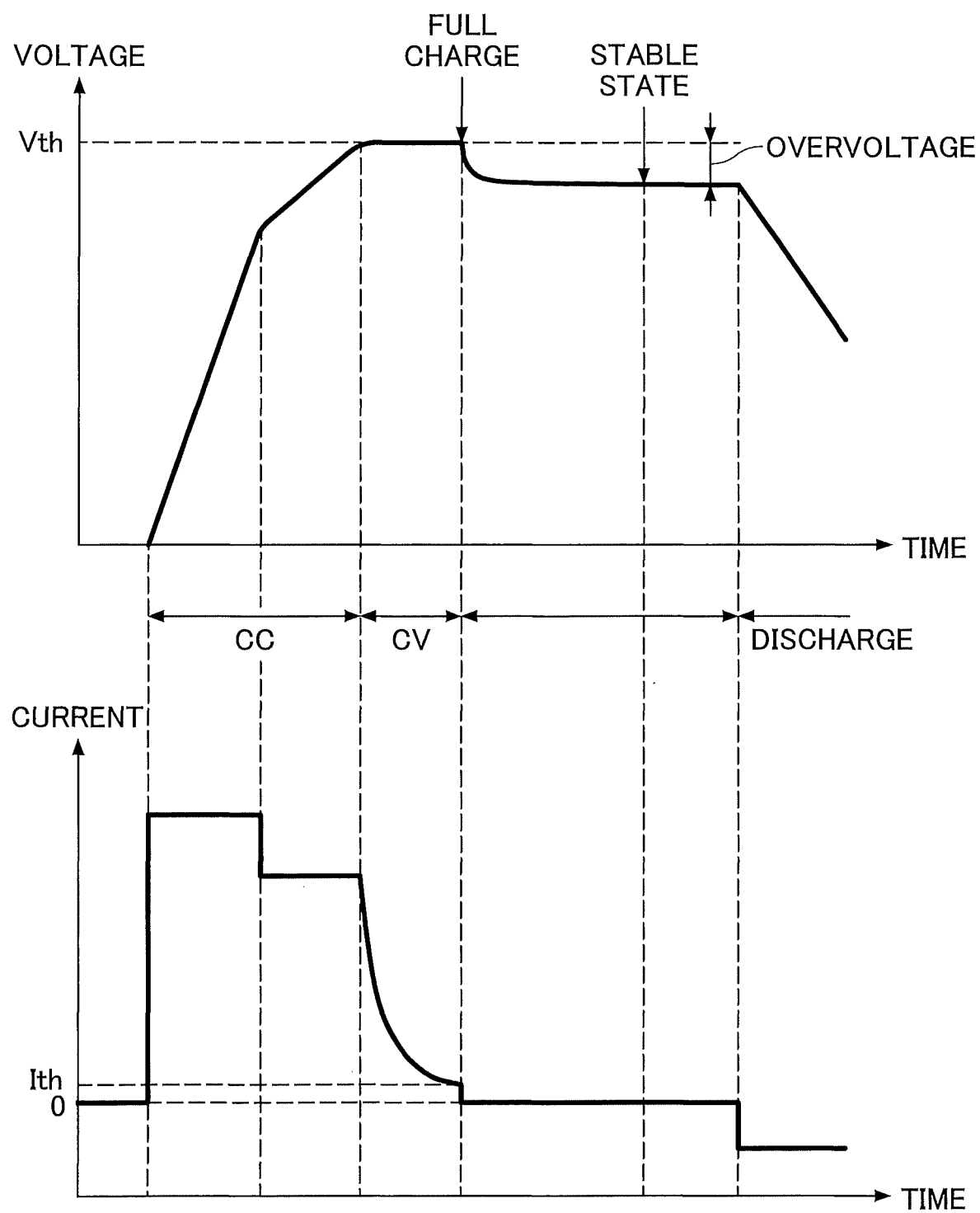
FIG. 24 is a graph illustrating a charging characteristic of the lithium-ion battery.

FIG. 23 is a flowchart illustrating the full charge detecting process. FIG. 24 is a graph illustrating a charging characteristic of the lithium-ion battery 301.

When a charging operation by the charge control unit 209 is started, the full charge detecting unit 310 initializes a variable that is used for measuring time. In the following description, the variable is referred to as a "timer variable". Subsequently, the full charge detecting unit 310 acquires the voltage detection value detected by the voltage detecting unit 303 (step S60), and acquires the current detection value detected by the current detecting unit 304 (step S61), as illustrated in FIG. 23.

In step S62, the full charge detecting unit 310 determines whether or not the acquired voltage detection value is equal to or greater than a predetermined threshold value Vth. If the voltage detection value is equal to or greater than the threshold value Vth (Yes in step S62), the full charge detecting unit 310 determines whether or not the current detection value is less than a predetermined threshold value Ith (step S63).

When the current detection value is less than the threshold value Ith (Yes in step S63), the full charge detecting unit 310 increments the timer variable (step S64). In step S65, the full charge detecting unit 310 determines whether or not the timer variable becomes equal to or greater than a predetermined threshold. In a case in which the timer variable becomes equal to or greater than the predetermined threshold, it means that a state in which the voltage detection value is equal to or greater than the threshold value Vth and in which the current detection value is less than the threshold value Ith has continued for a certain period of time. If the timer variable is not equal to or greater than the predetermined threshold (No in step S65), the full charge detecting unit 310 returns the process (full charge detecting process) to step S60.

If the voltage detection value is not equal to or greater than the threshold value Vth (step S62: No), or if the current detection value is not less than the threshold value Ith (step S63: No), the full charge detecting unit 310 resets the timer variable (step S67), and returns the process to step S60.

If the timer variable becomes equal to or greater than the predetermined threshold (Yes in step S65), that is, if the state in which the voltage detection value is equal to or greater than the threshold value Vth and in which the current detection value is less than the threshold value Ith has continued for the certain period of time, the full charge detecting unit 310 determines that the lithium-ion battery 301 has been fully charged (step S66). Note that the certain period of time mentioned above is, for example, a time selected from the range between 10 seconds and 1 minute.

The sequence of the above-described steps S60 to S63 is not limited thereto, and may be appropriately changed.

[Stable State Detecting Process]

Figure 25:
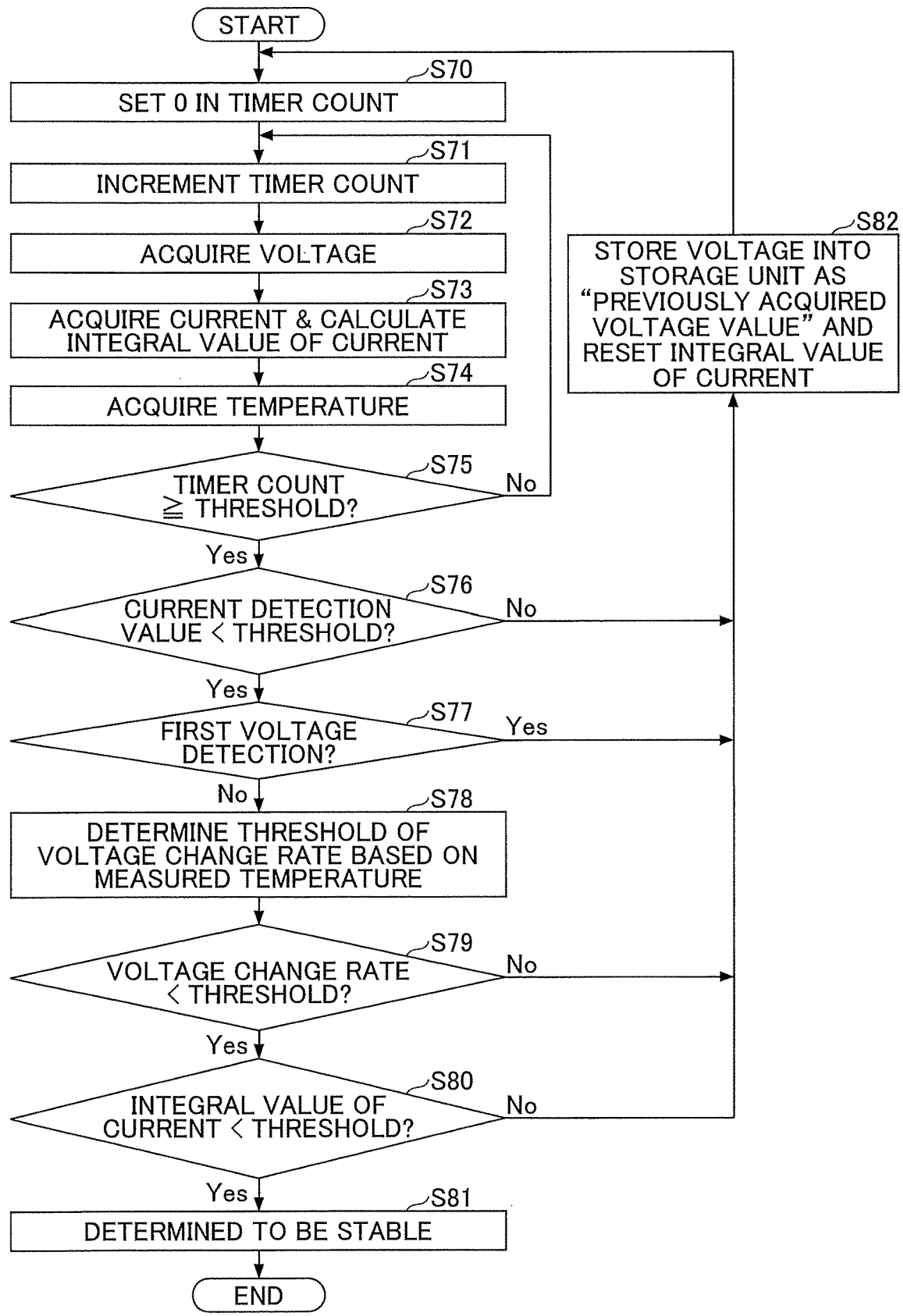
FIG. 25 is a flowchart illustrating a stable state detecting process.

Next, the stable state detecting process by the stability detecting unit 311 will be described in more detail. FIG. 25 is a flowchart illustrating the stable state detecting process.

The stability detecting unit 311 starts an operation when the full charge detecting unit 310 detects that the lithium-ion battery 301 is fully charged. In step S70, the stability detecting unit 311 sets a value (may also be referred to as a "timer count") of a timer (not illustrated) included in the controller 306 to 0 (zero). Next, the stable state detecting process proceeds to step S71.

In step S71, the stability detecting unit 311 increments the timer count of the timer (1 is added to the timer).

In step S72, the stability detecting unit 311 acquires the voltage detection value measured by the voltage detecting unit 303. In step S73, the stability detecting unit 311 acquires the current detection value measured by the current detecting unit 304, and calculates an integral current value.

In step S74, the stability detecting unit 311 acquires the temperature measured by the temperature detecting unit 305.

In step S75, the stability detecting unit 311 determines whether or not the timer count is equal to or greater than a threshold value. If it is determined that the timer count is not equal to or greater than the threshold value (in a case of No), the process (stable state detecting process) returns to step S71. Meanwhile, if it is determined that the timer count is equal to or greater than a threshold value (in a case of Yes), the process proceeds to step S76.

In step S76, the stability detecting unit 311 determines whether or not the current detection value measured by the current detecting unit 304 is less than a threshold value. If it is determined that the current detection value is not less than the threshold value (in a case of No), step S82 is executed next. In step S82, the stability detecting unit 311 stores the voltage detection value acquired in step S72 into the storage unit 307. The voltage detection value stored in the storage unit 307 is referred to as a "previously acquired voltage value". Further, the stability detecting unit 311 resets the integral current value, and the process returns to step S70. Meanwhile, if it is determined that the current detection value is less than the threshold value (Yes in step S76), the process proceeds to step S77.

In step S77, the stability detecting unit 311 determines whether or not the voltage detection value acquired in step S72 is the first data after the stable state detecting process is started. If it is determined that the voltage detection data acquired in step S72 is the first data (Yes in step S77), step S82 is executed next. Meanwhile, if it is determined that the voltage detection data acquired in step S72 is not the first data (No in step S77), the process proceeds to step S78.

In step S78, the stability detecting unit 311 determines a threshold of voltage change rate based on the temperature measured in step S74.

In step S79, the stability detecting unit 311 calculates the voltage change rate from the previously acquired voltage value stored in the storage unit 307 and the voltage detection value acquired at the current time in step S72, and compares the calculated voltage change rate with the threshold of voltage change rate determined in step S78. If it is determined that the calculated voltage change rate is not less than the threshold of voltage change rate (No in step S79), step S82 is executed next. Meanwhile, if it is determined that the calculated voltage change rate is less than the threshold of voltage change rate (Yes of voltage change rate), the process proceeds to step S80.

In step S80, the stability detecting unit 311 determines whether or not the integral current value calculated in step S73 is less than a threshold value. If it is determined that the integral current value is not less than the threshold value (No in step S80), step S82 is executed next. Meanwhile, if it is determined that the integral current value is less than the threshold value (Yes in step S80), the stability detecting unit 311 determines that the lithium-ion battery 301 is in a stable state (step S81).

The sequence of the above-described steps S70 to S82 is not limited thereto, and may be appropriately changed.

Further, a residual capacity meter for a secondary battery, which is disclosed in Japanese Laid-open Patent Application Publication No. 2011-169817 or the like, may be applied to the stability detecting unit 311, and a stable state may be detected based on a rate of change of a residual capacity (charge rate).

In the above-described embodiments, the state determining unit 220 performs the state determining process when a stable state is detected by the stability detecting unit 311. However, a trigger for execution of the state determining processing is not limited thereto, and the state determining processing may be executed at other timings, such as at regular intervals.

In the above embodiments, a case in which the electronic device is a smartphone has been described. However, the present invention is not limited to smartphones, but can be applied to various electronic devices.

While the specific embodiments of the present invention have been described in detail above, the invention is not limited to the above-described embodiments, and various modifications and substitutions can be made to the above-described embodiments without departing from the scope of the invention.

What is claimed is:

1. An electronic device comprising:
  a strain detection sensor attached to a secondary battery connected to the electronic device, the strain detection sensor being configured to detect an amount of strain of the secondary battery;
  a current detector connected to the secondary battery, the current detector being configured to detect a value of current charged to the secondary battery or discharged from the secondary battery;
  one or more processors; and
  a memory including program instructions that cause the one or more processors to perform a process including:
    detecting a deformation amount of the secondary battery using the amount of strain detected by the strain detection sensor;
    detecting a total charge/discharge amount of the secondary battery based on the value of current detected by the current detector, the total charge/discharge amount being a sum of an amount of charge that is discharged from the secondary battery since use of the secondary battery was started and an amount of charge that is charged to the secondary battery since the use of the secondary battery was started;
    determining a state of the secondary battery based on the deformation amount of the secondary battery, the total charge/discharge amount of the secondary battery, and reference data representing a relationship between the deformation amount and the total charge/discharge amount, the reference data being stored in the memory; and
    performing a notification based on a result of the state of the secondary battery.

2. The electronic device according to claim 1,
  wherein the program instructions further cause the one or more processors to calculate a difference between the deformation amount of the secondary battery and the reference data; and
  to perform the notification in a case in which the difference is equal to or greater than a first threshold value.

3. The electronic device according to claim 1,
  wherein the program instructions further cause the one or more processors to calculate an amount of change of the deformation amount of the secondary battery per unit charge/discharge amount; and
  to perform the notification in a case in which the amount of change is equal to or greater than a second threshold value.

4. The electronic device according to claim 1,
  wherein the program instructions further cause the one or more processors to calculate a rate of change of an amount of change of the deformation amount of the secondary battery per unit charge/discharge amount; and
  to perform the notification in a case in which the rate of change is equal to or greater than a third threshold value.

5. The electronic device according to claim 1, wherein the program instructions further cause the one or more processors to predict a future state of the secondary battery based on an amount of change of the deformation amount of the secondary battery per unit charge/discharge amount.

6. The electronic device according to claim 5, wherein the program instructions further cause the one or more processors to detect whether the secondary battery is fully charged, and to detect, in a case in which the secondary battery is fully charged, whether the secondary battery is in a stable state; and
  the determining of the state of the secondary battery is performed upon detection of the stable state of the secondary battery.

7. A method of determining a state of a secondary battery connected to an electronic device, the electronic device including a strain detection sensor attached to the secondary battery and a current detector connected to the secondary battery, the strain detection sensor being configured to detect an amount of strain of the secondary battery, the current detector being configured to detect a value of current charged to the secondary battery or discharged from the secondary battery, the method comprising:
  (a) acquiring a deformation amount of the secondary battery from the strain detection sensor;
  (b) acquiring a total charge/discharge amount of the secondary battery based on the value of current detected by the current detector, the total charge/discharge amount being a sum of an amount of charge that is discharged from the secondary battery since use of the secondary battery was started and an amount of charge that is charged to the secondary battery since the use of the secondary battery was started;
  (c) determining the state of the secondary battery based on the deformation amount detected at step (a), the total charge/discharge amount detected at step (b), and reference data representing a relationship between the deformation amount and the total charge/discharge amount, the reference data being stored in the electronic device; and
  (d) performing a notification based on a result of the state of the secondary battery determined at step (c).

* * * * *